United States Patent
Nakase et al.

(10) Patent No.: US 9,895,868 B2
(45) Date of Patent: Feb. 20, 2018

(54) METHOD FOR PRODUCING LAYERED PRODUCT, LAYERED PRODUCT, METHOD FOR PRODUCING LAYERED PRODUCT WITH DEVICE USING SAID LAYERED PRODUCT, AND LAYERED PRODUCT WITH DEVICE

(71) Applicant: TOYOBO CO., LTD., Osaka-shi, Osaka (JP)

(72) Inventors: Katsuki Nakase, Otsu (JP); Tetsuo Okuyama, Otsu (JP); Toshiyuki Tsuchiya, Otsu (JP); Satoshi Maeda, Otsu (JP); Kazuyuki Ouya, Otsu (JP)

(73) Assignee: Toyobo Co., Ltd., Osaka (JP)

( * ) Notice: Subject to any disclaimer, the term of this patent is extended or adjusted under 35 U.S.C. 154(b) by 458 days.

(21) Appl. No.: 14/408,206

(22) PCT Filed: Jun. 12, 2013

(86) PCT No.: PCT/JP2013/066194
§ 371 (c)(1),
(2) Date: Dec. 15, 2014

(87) PCT Pub. No.: WO2013/191052
PCT Pub. Date: Dec. 27, 2013

(65) Prior Publication Data
US 2015/0125665 A1    May 7, 2015

(30) Foreign Application Priority Data

Jun. 20, 2012  (JP) .................................. 2012-138754
Nov. 26, 2012  (JP) .................................. 2012-257656

(51) Int. Cl.
*B32B 3/10*    (2006.01)
*B32B 27/28*   (2006.01)
(Continued)

(52) U.S. Cl.
CPC ............ *B32B 27/281* (2013.01); *B32B 5/145* (2013.01); *B32B 7/06* (2013.01); *B32B 27/08* (2013.01);
(Continued)

(58) Field of Classification Search
None
See application file for complete search history.

(56) References Cited

U.S. PATENT DOCUMENTS 5,741,585 A *  4/1998  Harris ................ C08G 73/1085
                                                    428/357
9,611,358 B2 * 4/2017  Jeong ........................ B32B 7/06
(Continued)

FOREIGN PATENT DOCUMENTS

EP   2 380 732 A1   10/2011
JP   06-056992 A     3/1994
(Continued)

OTHER PUBLICATIONS

Japanese Patent Office, International Search Report in International Patent Application No. PCT/JP2013/066194 (dated Sep. 10, 2013).

*Primary Examiner* — Christopher Polley
(74) *Attorney, Agent, or Firm* — Leydig, Voit & Mayer, Ltd.

(57) ABSTRACT

By preparing a polyimide film with a face at the support side and subjected to a surface treatment; subjecting at least one of a face of the support and the face of the polyimide film which are opposite to each other to a patterning treatment using a coupling agent to form a satisfactorily bondable part and an easily releasable part which differ in adhesion/peel strength; subsequently, superposing the support and the polyimide film to be subjected to a pressurizing/heating treatment and to be bonded to each other, subjecting the surface of the polyimide film to an organic alkali treatment; and then, applying a polyamic acid solution free from a slip (Continued)

agent ingredient, drying the coating film and imidizing the film, a layered product having a structure of at least three layers in which at least one layer contains a slip agent material and both surface layers have no slip agent material is produced.

7 Claims, 6 Drawing Sheets

(51) Int. Cl.
| | |
|---|---|
| H05K 3/00 | (2006.01) |
| B32B 5/14 | (2006.01) |
| B32B 27/08 | (2006.01) |
| B32B 37/00 | (2006.01) |
| B32B 38/10 | (2006.01) |
| B32B 7/06 | (2006.01) |
| B32B 27/16 | (2006.01) |
| B32B 27/36 | (2006.01) |
| B32B 37/12 | (2006.01) |
| H05K 1/03 | (2006.01) |
| B32B 37/18 | (2006.01) |
| B32B 38/04 | (2006.01) |

(52) U.S. Cl.
CPC .............. *B32B 27/16* (2013.01); *B32B 27/36* (2013.01); *B32B 37/0038* (2013.01); *B32B 37/12* (2013.01); *B32B 38/10* (2013.01); *H05K 3/007* (2013.01); *B32B 37/182* (2013.01); *B32B 38/04* (2013.01); *B32B 2250/04* (2013.01); *B32B 2255/10* (2013.01); *B32B 2255/26* (2013.01); *B32B 2307/746* (2013.01); *B32B 2307/748* (2013.01); *B32B 2310/0831* (2013.01); *B32B 2379/08* (2013.01); *B32B 2457/00* (2013.01); *B32B 2457/08* (2013.01); *B32B 2457/14* (2013.01); *H05K 1/0346* (2013.01); *H05K 2201/0154* (2013.01); *Y10T 428/24612* (2015.01)

(56) References Cited

U.S. PATENT DOCUMENTS

| | | | |
|---|---|---|---|
| 2008/0259253 A1* | 10/2008 | Broer | B81B 3/0024 |
| | | | 349/86 |
| 2014/0041800 A1 | 2/2014 | Okuyama et al. | |
| 2014/0141683 A1* | 5/2014 | Zhou | H01L 51/003 |
| | | | 445/24 |

FOREIGN PATENT DOCUMENTS

| | | |
|---|---|---|
| JP | 11-504369 A | 4/1999 |
| JP | 11-505184 A | 5/1999 |
| JP | 2008-019348 A | 1/2008 |
| JP | 2008-159935 A | 7/2008 |
| JP | 2009-260387 A | 11/2009 |
| JP | 2010-283262 A | 12/2010 |
| JP | 2011-011455 A | 2/2011 |
| WO | WO 1996/034033 A1 | 10/1996 |
| WO | WO 1996/036204 A1 | 11/1996 |
| WO | WO 2010/071145 A1 | 6/2010 |
| WO | WO 2012/141248 A1 | 10/2012 |

* cited by examiner

US 9,895,868 B2

METHOD FOR PRODUCING LAYERED PRODUCT, LAYERED PRODUCT, METHOD FOR PRODUCING LAYERED PRODUCT WITH DEVICE USING SAID LAYERED PRODUCT, AND LAYERED PRODUCT WITH DEVICE

CROSS-REFERENCE TO RELATED APPLICATIONS

This patent application is the U.S. national phase of International Patent Application No. PCT/JP2013/066194, filed Jun. 12, 2013, which claims the benefit of Japanese Patent Application No. 2012-138754, filed on Jun. 20, 2012, and Japanese Patent Application No. 2012-257656, filed on Nov. 26, 2012, which are incorporated by reference in their entireties herein.

TECHNICAL FIELD

The present invention relates to a method for producing a polyimide layered product with a support including the polyimide layered product and the support, and the polyimide layered product with the support. In addition, the present invention relates to a method for producing a polyimide layered product with a device with a support prepared by forming the device on the polyimide layered product with the support, and the polyimide layered product with the device with the support, and relates to a method for producing a polyimide layered product with a device prepared by removing the support from the polyimide layered product with the device with the support, and the polyimide layered product with the device. The device is formed of a thin film of a semiconductor element, an MEMS element, a display element, or the like. The present invention relates to a method for obtaining a polyimide layered product with a device with a support prepared by, at the time of forming a device requiring fine processing on the polyimide film surface, temporarily or semipermanently bonding a polyimide film to a substrate made from an inorganic substance constituting the support, and the polyimide layered product with the device with the support, and relates to a method for producing a polyimide layered product with a device prepared by removing the support from the polyimide layered product with the device with the support, and the polyimide layered product with the device. Since this polyimide layered product with the device may be made flexible, the present invention relates to a flexible device.

Particularly, in detail, since a thin film made of a polyimide or the like excellent in heat resistance and insulation properties and a substrate made from one kind of inorganic substance selected from a glass plate, a ceramic plate, a silicon wafer and a metal which have a coefficient of linear thermal expansion almost comparable to that of the thin film are stacked, and furthermore, a slip agent-free layer is stacked on the surface of the polyimide film, the present invention relates to a layered product allowing a sophisticated circuit to be mounted thereon and being excellent in dimensional stability, heat resistance, insulation properties and surface smoothness, a device-attached layered product prepared by utilizing the layered product and forming a device such as a semiconductor element thereon, and a semiconductor-attached film device prepared by utilizing the device-attached layered product.

BACKGROUND ART

In recent years, for the purpose of attaining reduced weight and enhanced flexibility of a function element such as a semiconductor element, an MEMS element and a display element, the technological development for forming these elements on a polymeric film has been actively conducted.

It has been said that, for forming a function element such as a semiconductor element, an MEMS element and a display element on the polymeric film surface, processing by a so-called roll-to-roll process utilizing the flexibility which is one of characteristics of the polymeric film is ideal. However, in the semiconductor industry, MEMS industry and display industry, a process technique suitable for a wafer-based or glass substrate-based rigid planar substrate has been constructed. As a practical option, by bonding a polymeric film to a rigid support made from an inorganic substance such as a metal plate, a wafer and a glass substrate and peeling off the film from the support after forming a desired element, it is possible to obtain a function element formed on the polymeric film utilizing the existing infrastructure. With regard to the polymeric film used at the time of bonding the polymeric film to the support made from an inorganic substance, the surface smoothness, dimensional stability, cleanness, resistance to process temperature, and resistance to a chemical liquid used in fine processing which are at a level sufficient for preventing troubles in forming the function element are required.

In a thin film transistor element and the like, the surface smoothness has been known to largely affect the element performance. Moreover, in the case where there is a scratch or the like on the surface, the case is not desirable because the scratch or the like causes disconnection of wiring.

With regard to the dimensional stability, among semiconductor thin films. Si has a coefficient of linear thermal expansion of approximately 3 ppm/° C., and in the case where this thin film is deposited on a substrate, when the difference in the coefficient of linear thermal expansion between the substrate and the thin film is large, the stress accumulated in the thin film causes the deterioration in performance, and the warpage and exfoliation of the thin film. Particularly, in the case where the thin film is heated at a high temperature during the film forming process, it follows that the stress caused by the difference in the coefficient of linear thermal expansion between the substrate and the thin film increases with a change in temperature. With regard to the resistance to process temperature, in the formation of a low-temperature polysilicon thin film transistor, there is a case where a treatment of heating at 450° C. for 2 hours is required in a dehydrogenation process. Moreover, for forming a hydrogenated amorphous silicon thin film, there is a possibility that a substrate is heated at a temperature of approximately 200° C. to 300° C. In this case, even when a thermoplastic resin is used as the polymeric film, the performance is unsatisfactory.

With regard to the resistance to a chemical liquid used in fine processing, since a chemical liquid treatment including an acid treatment and an alkali treatment, a vacuum step of forming a thin film, and the like are included in a semiconductor process in which the resist coating, exposure, etching and resist peeling are repeated, the resistance to a chemical liquid used therein is required.

As the material of a base material of an electronic component such as information and communication equipment (broadcast equipment, mobile radio equipment, portable communication equipment, and the like), radar equipment and a high speed information processor, ceramic has hitherto been used. The base material made from ceramic has heat resistance and is adaptable to the heightened frequency (up to GHz band) in the signal band of the information and communication equipment in recent years. However, since ceramic is not flexible and cannot be made thin, the applicable field is restricted.

On that account, investigations have been conducted for the purpose of using a polymeric film made from an organic material as a base material of an electronic component, and there have been proposed a polymeric film made from a polymer such as polyethylene naphthalate and polyethylene terephthalate, a film made from a polyimide, a film made from polytetrafluoroethylene, and glass fiber-reinforced epoxies. The film made from a polyimide is excellent in heat resistance and is tough, and therefore the film has a merit that the polymeric film can be made thin.

Since these polyimide films generally have a large coefficient of linear thermal expansion, and have problems that the dimensional change caused by the change in temperature is significant and these films are not suitable for the production of a circuit having fine wiring, the applicable field is restricted. As described above, a device including a polyimide film with physical properties satisfactory for a base material provided with heat resistance, high mechanical properties and flexibility has not yet been obtained.

As a polyimide film with a heightened tensile elastic modulus, there has been proposed a polyimide benzoxazole film made from a polyimide having a benzoxazole ring in the main chain (see PTD 1). There has also been proposed a printed wiring board including the polyimide benzoxazole film as a dielectric layer (see PTD 2 and PTD 3). Although these polyimide benzoxazole films made from a polyimide having a benzoxazole ring in the main chain have an improved tensile breaking strength, an improved tensile elastic modulus, and a satisfactory coefficient of linear thermal expansion, in contrast to their excellent mechanical properties, the thinner the film is, the more difficult it is to be handled. Accordingly, these films still have problems that they are insufficient from mechanical and dynamical aspects, and the like.

Although a polyimide having a biphenyl structure in the main chain also has an improved tensile breaking strength, an improved tensile elastic modulus, and a satisfactory coefficient of linear thermal expansion, in contrast to its excellent mechanical properties, the thinner the polyimide film is, the more difficult it is to be handled. Accordingly, the polyimide film still has problems that it is insufficient from mechanical and dynamical aspects, and the like.

Bonding a polymeric film to an inorganic substrate using a tackiness agent or an adhesive agent and processing the layered product have been heretofore widely performed (PTD 4). However, with regard to polysilicon, an oxide semiconductor, and the like, in the case where a process in a temperature range of approximately 200 to 500° C. is required, no method is known in which an adhesive agent or a tackiness agent for bonding use having a sufficient resistance for practical use is employed. Moreover, since the conventional thermoplastic resin generally has a large coefficient of linear thermal expansion and there is a limit for making this layer thin, as compared to a polyimide film and a substrate made from an inorganic substance, an adhesive layer made of a thermoplastic resin and the like has a tendency to adversely affect the dimensional stability in a heating process.

As a procedure for attaining the heat resistance, there has been disclosed a procedure of performing a step of forming a resin substrate on a fixed substrate with an amorphous silicon film constituting a peeling layer interposed therebetween, a step of forming at least a TFT element on the resin substrate, and a step of irradiating the amorphous silicon film with a laser beam and then peeling off the resin substrate along the amorphous silicon film from the fixed substrate to prepare a display device having flexibility by using the resin substrate (PTD 5). However, at the time of peeling, since laser radiation to an adhesive agent layer is performed and etching means is used, the process is complicated and requires high production costs. Bonding two polymeric films together by UV irradiation has been disclosed (PTD 6), and it has been described that using a coupling agent in this case is also effective, but the case only relates to bonding between two polymeric films and does not relate to performing the adhesion/peel force control relating to the coupling agent itself by UV light irradiation.

In the case of a device in which the film is required to have surface smoothness, in general, as compared to the surface of a glass substrate, a film containing a slip agent has large surface roughness. Therefore, the film excellent in productivity is difficult to be used for the device. Moreover, in the case where a film free from a slip agent is transported by many rolls, the film inevitably suffers from fine scratches during the process. As such, except to apply a varnish free from a slip agent directly to a glass substrate or the like and bake the coating film, it has been difficult to prepare a smooth surface.

CITATION LIST

Patent Document

PTD 1: Japanese Patent Laying-Open No. 06-056992
PTD 2: National Patent Publication No. 11-504369
PTD 3: National Patent Publication No. 11-505184
PTD 4: Japanese Patent Laying-Open No. 2008-159935
PTD 5: Japanese Patent Laying-Open No. 2009-260387
PTD 6: Japanese Patent Laying-Open No. 2008-19348

SUMMARY OF INVENTION

Technical Problem

The present invention has been made in view of the above-mentioned circumstances, and an object thereof is to provide a polyimide layered product with a support which constitutes a base material for allowing various devices to be stacked thereon, has a smooth surface, allows a sophisticated device to be prepared therewith, does not peel off in a high-temperature process on preparing a device, and furthermore, allows the polyimide layered product to be easily peeled off from the support after a device has been prepared on the polyimide layered product. Moreover, since the dimensional change of the polyimide layered product is small, the polyimide layered product is suitable for the production of a circuit having fine wiring and is suitable for the preparation of a device on the polyimide layered product.

Solution to Problem

As a result of extensive researches, the present inventors have found that a layered product with a support, in which the polyimide layered product provided with heat resistance, flexibility and surface smoothness at a high level and the support made of a glass plate, a ceramic plate, a silicon wafer, a metal and the like which have a coefficient of linear thermal expansion almost comparable to that of the polyimide are stacked, the polyimide surface is extremely smooth, the layered product is excellent in heat resistance and insulation properties, and the support and the polyimide can be easily peeled off from each other, is extremely useful at the time of being used for the preparation of an electronic device, and the like, and have found a polyimide film layered product which can be bonded to a substrate made from an inorganic substance that can be used therefor without using an adhesive agent, is excellent in adhesivity, does not cause troubles at the time of being peeled off from the support, and allows a sophisticated circuit to be formed on the smooth surface.

That is, the present invention has the following configuration.

1) A method for producing a polyimide layered product with a support including at least the support and the polyimide layered product, the polyimide layered product being a layered product having a structure of at least three layers in which at least one layer contains a slip agent and both surface layers have no slip agent, including: preparing a polyimide film with a face opposite to the support and subjected to a surface treatment; subjecting at least one of a face of the support and the face of the polyimide film which are opposite to each other to a patterning treatment using a coupling agent to form a satisfactorily bondable part and an easily releasable part which differ in adhesion/peel strength; subsequently, superposing the support and the polyimide film to be subjected to a pressurizing/heating treatment; subjecting the polyimide film to an organic alkali treatment after the polyimide film is bonded to the support by the pressurizing/heating treatment; and then, applying a polyamic acid solution (A) free from a slip agent ingredient, drying the coating film and imidizing the film.

2) The method described in 1), wherein the polyamic acid solution (A) is a polyamic acid solution obtained by the reaction of an aromatic tetracarboxylic acid and an aromatic diamine having a benzoxazole structure (skeleton).

3) The method described in 1), wherein the polyamic acid solution (A) is a polyamic acid solution obtained by the reaction of 3,3',4,4'-biphenyltetracarboxylic acid dianhydride and an aromatic diamine.

4) The method described in any one of 1) to 3), wherein the patterning treatment is performed by subjecting the face to a coupling agent treatment to form a coupling-treated layer, and then, subjecting a part of the coupling-treated layer to a deactivation treatment to form a prescribed pattern.

5) The method described in 4), wherein at least one kind selected from the group consisting of a blast treatment, a vacuum plasma treatment, an atmospheric pressure plasma treatment, a corona treatment, an active radiation irradiation treatment, an active gas treatment, a UV irradiation treatment, an ozone treatment and a chemical liquid treatment is performed as the deactivation treatment.

6) The method described in 5), wherein at least the UV irradiation treatment is performed as the deactivation treatment.

7) The method described in any one of 1) to 6), wherein a film obtained by the reaction of an aromatic diamine having a benzoxazole structure and a tetracarboxylic acid is used as the polyimide film.

8) A polyimide layered product with a support prepared by stacking the support and the polyimide layered product with a coupling-treated layer interposed therebetween, including a satisfactorily bondable part and an easily releasable part which differ in peel strength between the support and the polyimide layered product, the satisfactorily bondable part and the easily releasable part forming a prescribed pattern, and the polyimide layered product being a layered product having a structure of at least three layers in which at least one layer contains a slip agent and both surface layers have no slip agent.

9) The polyimide layered product with the support described in 8), wherein the 180-degree peel strength between the support and the polyimide layered product in the easily releasable part is less than or equal to one-half of the 180-degree peel strength between the support and the polyimide layered product in the satisfactorily bondable part.

10) A method for producing a polyimide layered product with a device including the device formed on the polyimide layered product with the support mentioned above, including preparing the device on the polyimide layered product surface of the easily releasable part in the layered product, and then, making an incision at a polyimide layered product portion of the easily releasable part to peel off the polyimide layered product from the support.

11) A polyimide layered product with a device including the device formed on the polyimide layered product with the support mentioned above, being obtained by preparing the device on the polyimide layered product surface of the easily releasable part in the layered product, and then, making an incision at a polyimide layered product portion of the easily releasable part to peel off the polyimide layered product from the support.

Advantageous Effects of Invention

According to the present invention, since the polyimide layered product with the support is in a state of being supported by a support having heat resistance and rigidity, at the time of the circuit wiring preparation and the semiconductor formation, precise positioning can be performed to perform the preparation of multi-layered thin films, the circuit formation and the like, and thin film deposition and the like can be performed without peeling off the polyimide layered product from the support even in a high-temperature process at the time of the semiconductor formation. Furthermore, since the surface of the polyimide layered product on which the device preparation is performed is smooth, there are provided a polyimide layered product with a support used for the preparation of a high-performance device and for a polyimide layered product with a device on which a circuit with extremely little defects in wiring and a semiconductor element are formed, and a polyimide layered product with a support with a device.

Moreover, when a support is peeled off from a polyimide layered product with a device with the support on which this circuit and the semiconductor element are formed, since an easily releasable part can be easily peeled off in the case where only the easily releasable part in the pattern is peeled off, it is possible to provide a polyimide layered product with a device without breaking the prepared semiconductor.

At the time of performing precise positioning to perform the preparation of multi-layered thin films, the circuit formation and the like, on the circuit wiring preparation, when a shape variable polyimide film unsatisfactory in dimensional stability is used alone as the support, it becomes difficult to perform positioning for the device preparation. On the other hand, in a method of fixing a polyimide film to a rigid support excellent in dimensional stability and peeling off this rigid support after the device preparation, a layered product with which peeling between a polyimide film and a support can be smoothly performed and having a peel strength by which exfoliation is not caused at the time of passing the process has been required. This enables the conventional electronic device preparation process to be used as it is, and it is possible to stably perform the device preparation on a polyimide film with precision. Particularly, the polyimide layered product with the support according to the present invention is a layered product useful for the case where the circuit formation is performed at a high temperature and for the formation of a sophisticated circuit, and there is provided a polyimide layered product with a support in which a polyimide film after the formation of a circuit and the like can be easily peeled off from the support.

Moreover, although solar cells and the like made from single-crystal Si and polycrystalline Si have problems in handling during a process and in durability after their completion since they have become thin and are easily broken, the polyimide layered product with the support according to the present invention can also be utilized as a reinforced substrate prepared by bonding a polyimide film. In this case, since there is a part easily peeled off, a reinforced substrate capable of electrode drawing can be prepared.

Moreover, in the case where a polyimide varnish is applied to a support and then peeled off to prepare a polyimide film, there are problems that the concentric film thickness distribution is given on the polyimide film, the polyimide film suffers from warpage when peeled off because of the difference between the structures of front and back surfaces, and it is difficult to keep the physical properties of the polyimide film unchanged so as to maintain moderate peel strength. In contrast, in the case of bonding a film prepared separately as in the present invention, the uniformity of film thicknesses at the points within a narrow area on a wafer, a sheet of glass or the like is extremely high, and the case is suitable for the circuit preparation because either of previously forming a circuit and then bonding, and bonding and then forming a circuit is acceptable.

DESCRIPTION OF EMBODIMENTS

<Polyimide Film>

Figure 1:
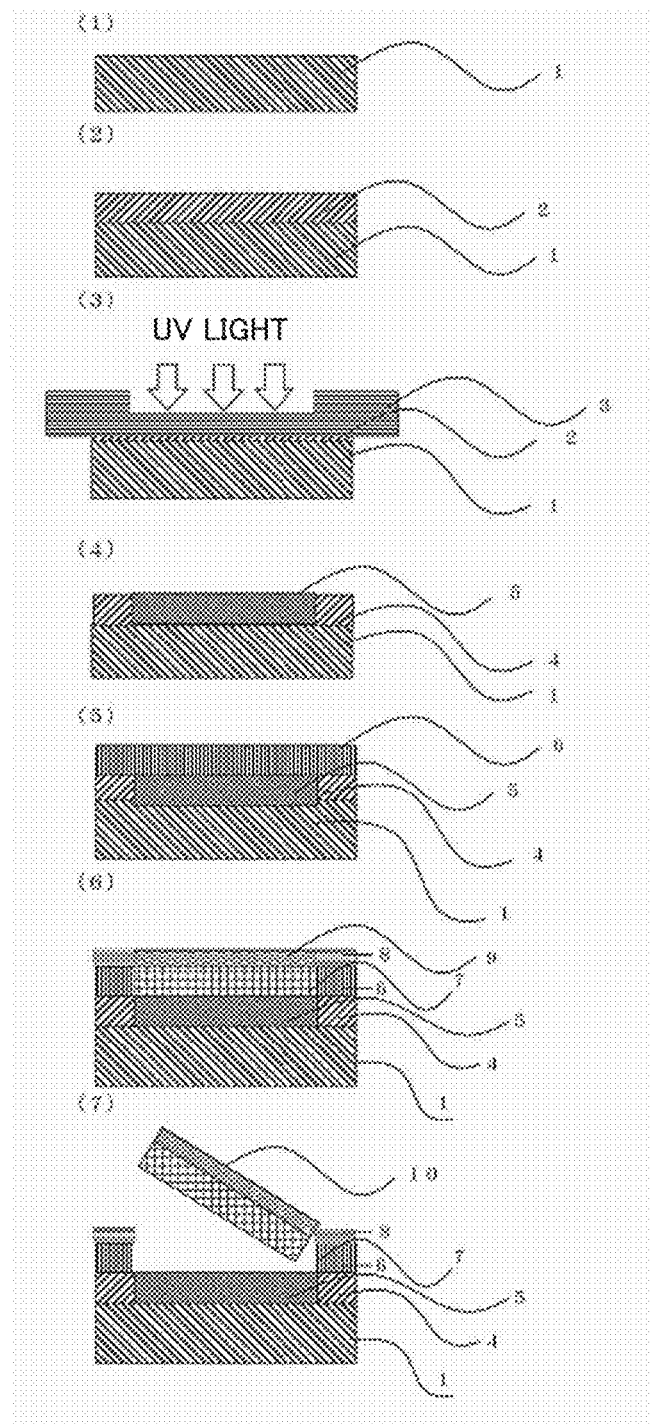
FIG. 1 is a schematic view showing one embodiment of the method for producing a polyimide layered product according to the present invention.
Figure 2:
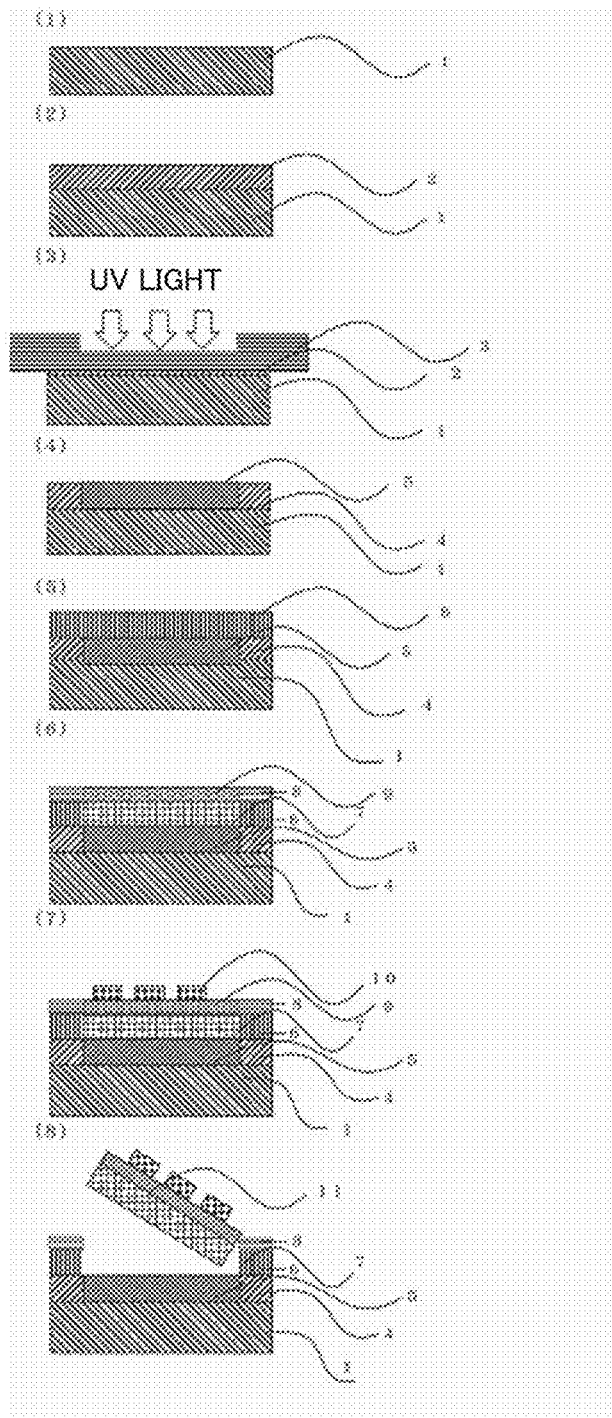
FIG. 2 is a schematic view showing one embodiment of the method for producing a polyimide layered product with a device according to the present invention.
Figure 3:
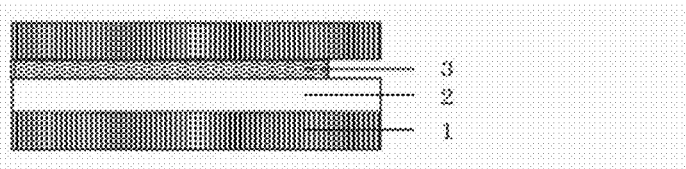
FIG. 3 is a schematic view showing one embodiment of the peel strength measurement for a varnish layer.
Figure 4:
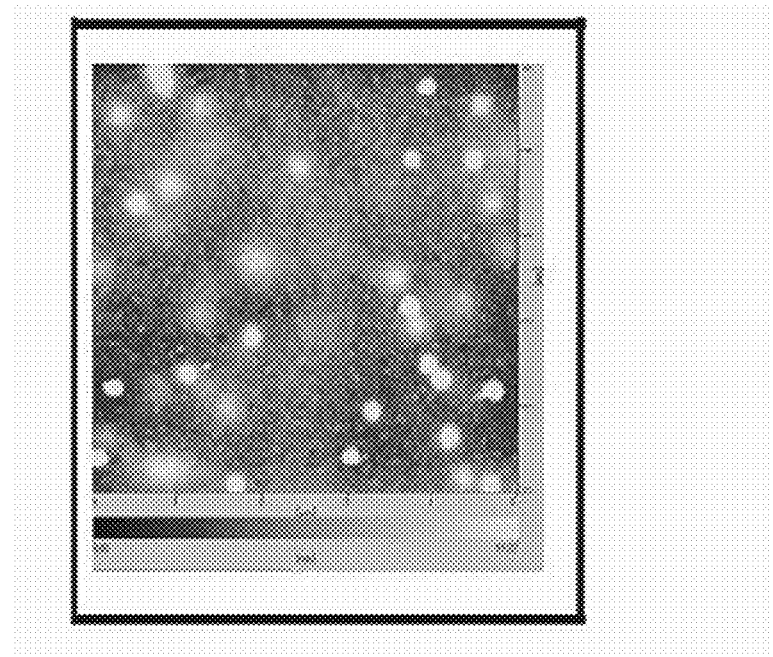
FIG. 4 is an AFM image (5 μm square) showing a polyimide film surface.
Figure 5:
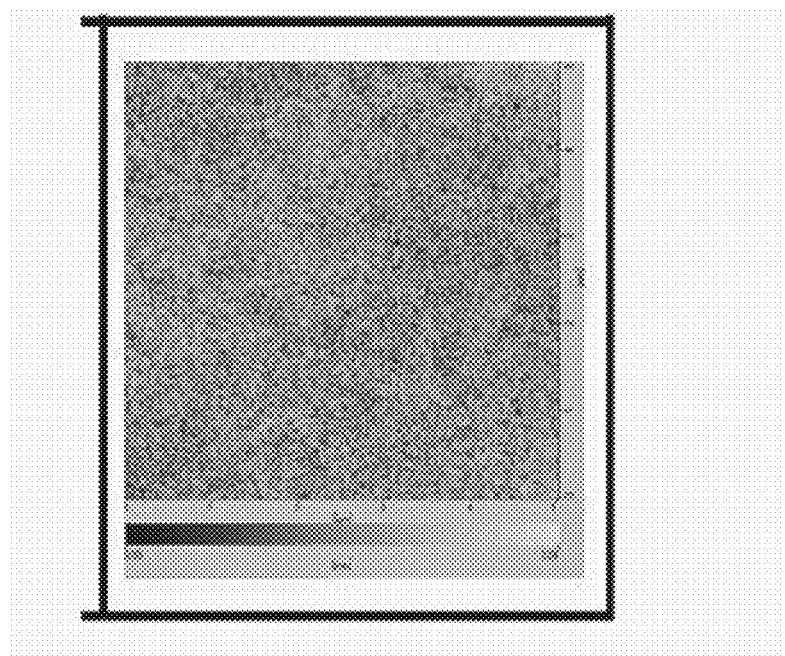
FIG. 5 is an AFM image (5 μm square) showing a varnish layer surface of the polyimide layered product according to the present invention.
Figure 6:
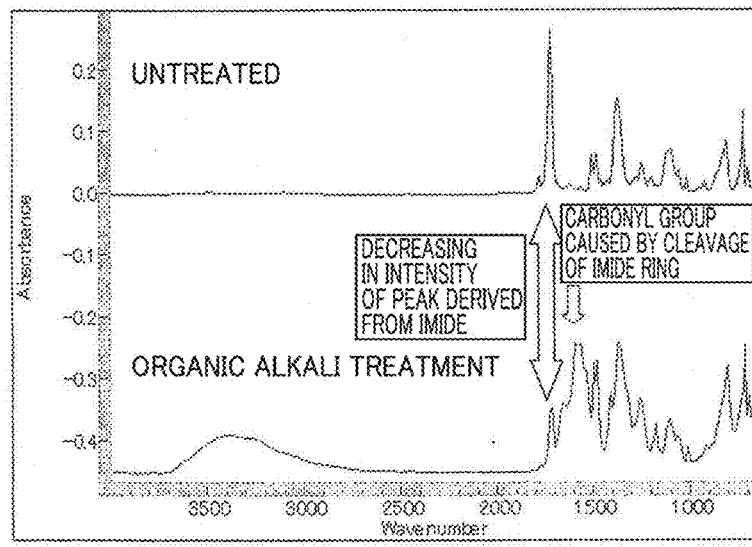
FIG. 6 shows IR spectra obtained before and after the organic alkali treatment of a polyimide film.
Figure 7:
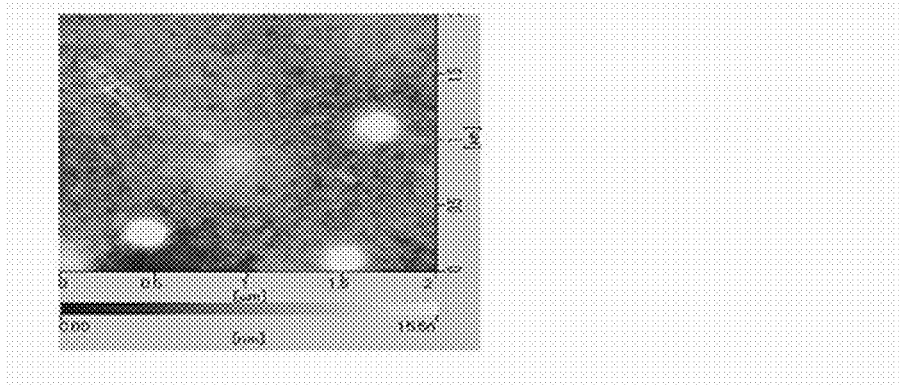
FIG. 7 is an AFM image (2 μm square) obtained before the organic alkali treatment of a polyimide film.
Figure 8:
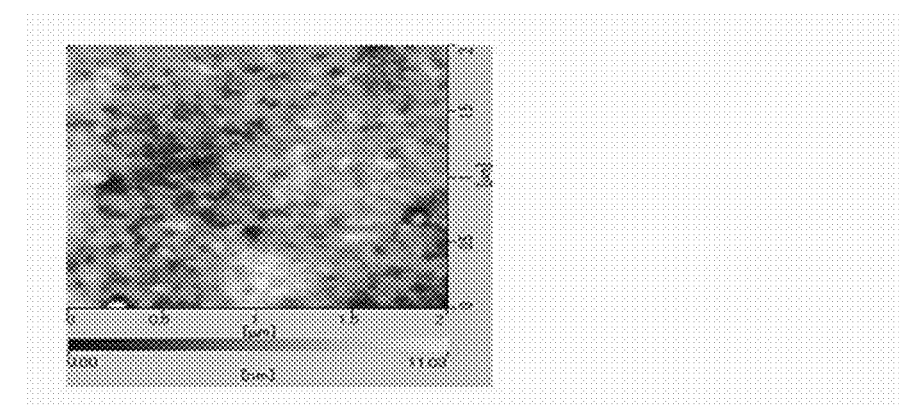
FIG. 8 is an AFM image (2 μm square) obtained after the organic alkali treatment of a polyimide film.

It is preferred that the polyimide film used in the present invention be a film of a polyimide obtained by the reaction of an aromatic diamine and an aromatic tetracarboxylic acid, and it is more preferred that the polyimide film have a coefficient of linear thermal expansion (in either of the lengthwise direction and the widthwise direction of the film) of −5 ppm/° C. to +30 ppm/° C., and be a polyimide film in which the combination of an aromatic diamine and an aromatic tetracarboxylic acid is any of the following combinations.

A. The combination of an aromatic tetracarboxylic acid having a pyromellitic acid residue and an aromatic diamine having a benzoxazole structure (skeleton).

B. The combination of an aromatic diamine having a phenylenediamine skeleton and an aromatic tetracarboxylic acid having a biphenyltetracarboxylic acid skeleton.

C. One prepared by dispersing nanosilica in the combination of an aromatic tetracarboxylic acid having a pyromellitic acid residue and an aromatic diamine having a diaminodiphenyl ether (skeleton). Of these, A is especially preferred.

In general, a polyimide film is obtained by applying a polyamic acid (polyimide precursor) solution obtained by allowing a diamine and a tetracarboxylic acid anhydride to undergo a reaction in a solvent to a support, drying the coating film to prepare a green film (also referred to as a precursor film or a polyamic acid film), and furthermore, subjecting the green film on a support for the polyimide preparation or after being peeled off from the support to a high-temperature heat treatment to perform a dehydrative ring-closing reaction. In this connection, a support for the polyimide film preparation referred to herein differs from the "support" as a constituting member of the layered product according to the present invention.

As a production method thereof, in a portion of a polyimide precursor solution obtained by the reaction of an aromatic diamine and an aromatic tetracarboxylic acid, a slip agent material (particles) with an average particle diameter of 0.05 to 2.5 μm is added in an amount of 0.4% by mass to 50% by mass, and in another portion thereof, a slip agent material (particles) with an average particle diameter of 0.05 to 2.5 μm is not added or added in an amount less than or equal to 0.2% by mass to prepare two solutions. A polyimide film is produced by stacking a slip agent material-containing polyimide layer and a slip agent material-free polyimide layer prepared from the two solutions.

Specifically, examples of an aromatic diamine having a benzoxazole structure preferably used in the present invention include the following ones, and the diamines may be used alone or may be used in combination of two or more thereof.

[Chemical Formula 1]

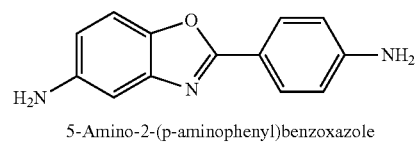

5-Amino-2-(p-aminophenyl)benzoxazole

[Chemical Formula 2]

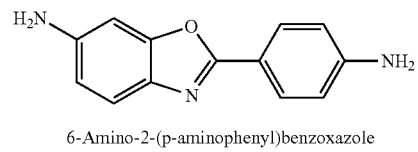

6-Amino-2-(p-aminophenyl)benzoxazole

[Chemical Formula 3]

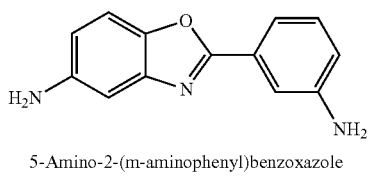

5-Amino-2-(m-aminophenyl)benzoxazole

[Chemical Formula 4]

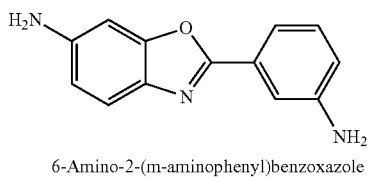

6-Amino-2-(m-aminophenyl)benzoxazole

[Chemical Formula 5]

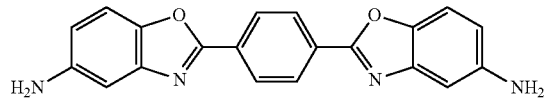

2,2'-p-Phenylenebis(5-aminobenzoxazole)

[Chemical Formula 6]

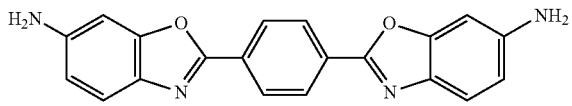

2,2'-p-Phenylenebis(6-aminobenzoxazole)

[Chemical Formula 7]

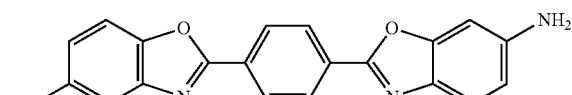

1-(5-Aminobenzoxazolo)-4-(6-aminobenzoxazolo)benzene

[Chemical Formula 8]

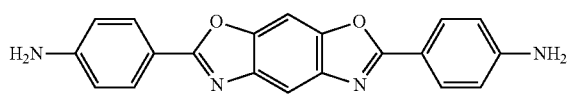

2,6-(4,4'-Diaminodiphenyl)benzo[1,2-d:5,4-d']bisoxazole

[Chemical Formula 9]

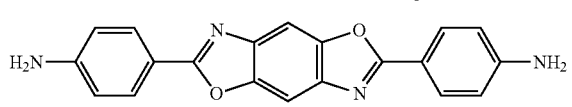

2,6-(4,4'-Diaminodiphenyl)benzo[1,2-d:4,5-d']bisoxazole

[Chemical Formula 10]

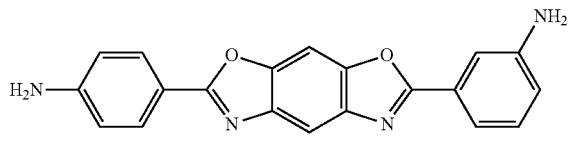

2,6-(3,4'-Diaminodiphenyl)benzo[1,2-d:5,4-d']bisoxazole

[Chemical Formula 11]

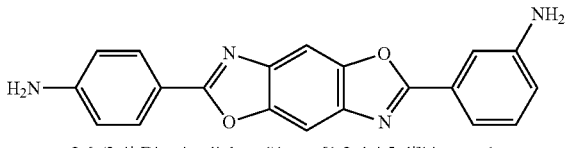

2,6-(3,4'-Diaminodiphenyl)benzo[1,2-d:4,5-d']bisoxazole

[Chemical Formula 12]

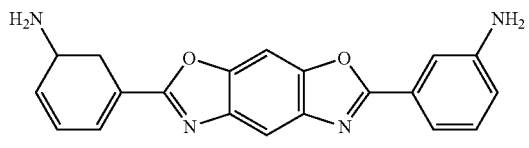

2,6-(3,3'-Diaminodiphenyl)benzo[1,2-d:5,4-d']bisoxazole

[Chemical Formula 13]

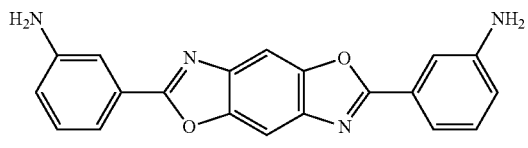

2,6-(3,3'-Diaminodiphenyl)benzo[1,2-d:4,5-d']bisoxazole

Of these, from the viewpoint of ease of synthesizing, the respective isomers of the amino(aminophenyl)benzoxazole are preferred, and 5-amino-2-(p-aminophenyl)benzoxazole is more preferred. In this context, "respective isomers" refer to the respective isomers defined according to the arrangement positions of two amino groups which the amino (aminophenyl)benzoxazole has (for example, the respective compounds described in the above-mentioned "Chemical Formula 1" to "Chemical Formula 4"). These diamines may be used alone or may be used in combination of two or more thereof. Moreover, in the case where the diamines contain an aromatic diamine having a benzoxazole structure, it is preferred that the amount thereof to be used be set to an amount greater than or equal to 70% by mole and it is more preferred that the amount thereof to be used be set to an amount greater than or equal to 75% by mole, in the whole amount of diamines.

In the present invention, one kind or two or more kinds of diamines mentioned below may be combinedly used. Examples of such diamines include 4,4'-bis(3-aminophenoxy)biphenyl, bis[4-(3-aminophenoxy)phenyl]ketone, bis[4-(3-aminophenoxyl)phenyl]sulfide, bis[4-(3-aminophenoxyl)phenyl]sulfone, 2,2-bis[4-(3-aminophenoxyl)phenyl]propane, 2,2-bis[4-(3-aminophenoxyl)phenyl]-1,1,1,3,3,3-hexafluoropropane, m-phenylenediamine, o-phenylenediamine, p-phenylenediamine, m-aminobenzylamine, p-aminobenzylamine, 3,3'-diaminodiphenyl ether, 3,4'-diaminodiphenyl ether, 4,4'-diaminodiphenyl ether, 3,3'-diaminodiphenyl sulfide, 3,3'-diaminodiphenyl sulfoxide, 3,4'-diaminodiphenyl sulfoxide, 4,4'-diaminodiphenyl sulfoxide, 3,3'-diaminodiphenyl sulfone, 3,4'-diaminodiphenyl sulfone, 4,4'-diaminodiphenyl sulfone, 3,3'-diaminobenzophenone, 3,4'-diaminobenzophenone, 4,4'-diaminobenzophenone, 3,3'-diaminodiphenylmethane, 3,4'-diaminodiphenylmethane, 4,4'-diaminodiphenylmethane, bis[4-(4-aminophenoxyl)phenyl]methane, 1,1-bis[4-(4-aminophenoxyl)phenyl]ethane, 1,2-bis[4-(4-aminophenoxyl)phenyl]ethane, 1,1-bis[4-(4-aminophenoxyl)phenyl]propane, 1,2-bis[4-(4-aminophenoxyl)phenyl]propane, 1,3-bis[4-(4-aminophenoxyl)phenyl]propane, 2,2-bis[4-(4- aminophenoxyl)phenyl]propane, 1,1-bis[4-(4-aminophenoxyl)phenyl]butane, 1,3-bis[4-(4-aminophenoxyl)phenyl]butane, 1,4-bis[4-(4-aminophenoxyl)phenyl]butane, 2,2-bis[4-(4-aminophenoxyl)phenyl]butane, 2,3-bis[4-(4-aminophenoxy)phenyl]butane, 2-[4-(4-aminophenoxyl)phenyl]-2-[4-(4-aminophenoxy)-3-methylphenyl]propane, 2,2-bis[4-(4-aminophenoxy)-3-methylphenyl]propane, 2-[4-(4-aminophenoxyl)phenyl]-2-[4-(4-aminophenoxy)-3,5-dimethylphenyl]propane, 2,2-bis[4-(4-aminophenoxy)-3,5-dimethylphenyl]propane, 2,2-bis[4-(4-aminophenoxyl)phenyl]-1,1,1,3,3,3-hexafluoropropane, 1,4-bis(3-aminophenoxy)benzene, 1,3-bis(3-aminophenoxy)benzene, 1,4-bis(4-aminophenoxy)benzene, 4,4'-bis(4-aminophenoxy)biphenyl, bis[4-(4-aminophenoxyl)phenyl]ketone, bis[4-(4-aminophenoxyl)phenyl]sulfide, bis[4-(4-aminophenoxyl)phenyl]sulfoxide, bis[4-(4-aminophenoxyl)phenyl]sulfone, bis[4-(3-aminophenoxyl)phenyl]ether, bis[4-(4-aminophenoxyl)phenyl]ether, 1,3-bis[4-(4-aminophenoxyl)benzoyl]benzene, 1,3-bis[4-(3-aminophenoxyl)benzoyl]benzene, 1,4-bis[4-(3-aminophenoxy)benzoyl]benzene, 4,4'-bis[(3-aminophenoxy)benzoyl]benzene, 1,1-bis[4-(3-aminophenoxyl)phenyl]propane, 1,3-bis[4-(3-aminophenoxyl)phenyl]propane, 3,4'-diaminodiphenyl sulfide, 2,2-bis[3-(3-aminophenoxyl)phenyl]-1,1,1,3,3,3-hexafluoropropane, bis[4-(3-aminophenoxyl)phenyl]methane, 1,1-bis[4-(3-aminophenoxyl)phenyl]ethane 1,2-bis[4-(3-aminophenoxyl)phenyl]ethane, bis[4-(3-aminophenoxyl)phenyl]sulfoxide, 4,4'-bis[3-(4-aminophenoxyl)benzoyl]diphenyl ether, 4,4'-bis[3-(3-aminophenoxyl)benzoyl]diphenyl ether, 4,4'-bis[4-(4-amino-α,α-dimethylbenzyl)phenoxy]benzophenone, 4,4'-bis[4-(4-amino-α,α-dimethylbenzyl)phenoxy]diphenyl sulfone, bis[4-{4-(4-aminophenoxyl)phenoxy}phenyl]sulfone, 1,4-bis[4-(4-aminophenoxyl)phenoxy-α,α-dimethylbenzyl]benzene, 1,3-bis[4-(4-aminophenoxyl)phenoxy-α,α-dimethylbenzyl]benzene, 1,3-bis[4-(4-amino-6-trifluoromethylphenoxy)-α,α-dimethylbenzyl]benzene, 1,3-bis[4-(4-amino-6-fluorophenoxy)-α,α-dimethylbenzyl]benzene, 1,3-bis[4-(4-amino-6-methylphenoxy)-α,α-dimethylbenzyl]benzene, 1,3-bis[4-(4-amino-6-cyanophenoxy)-α,α-dimethylbenzyl]benzene, 3,3'-diamino-4,4'-diphenoxybenzophenon, 4,4'-diamino-5,5'-diphenoxybenzophenone, 3,4'-diamino-4,5'-diphenoxybenzophenone, 3,3'-diamino-4-phenoxybenzophenone, 4,4'-diamino-5-phenoxybenzophenone, 3,4'-diamino-4-phenoxybenzophenone, 3,4'-diamino-5'-phenoxybenzophenone, 3,3'-diamino-4,4'-dibiphenoxybenzophenone, 4,4'-diamino-5,5'-dibiphenoxybenzophenone, 3,4'-diamino-4,5'-dibiphenoxybenzophenone, 3,3'-diamino-4-biphenoxybenzophenone, 4,4'-diamino-5-biphenoxybenzophenone, 3,4'-diamino-4-biphenoxybenzophenone, 3,4'-diamino-5'-biphenoxybenzophenone, 1,3-bis(3-amino-4-phenoxybenzoyl)benzene, 1,4-bis(3-amino-4-phenoxybenzoyl)benzene, 1,3-bis(4-amino-5-phenoxybenzoyl)benzene, 1,4-bis(4-amino-5-phenoxybenzoyl)benzene, 1,3-bis(3-amino-4-biphenoxybenzoyl)benzene, 1,4-bis(3-amino-4-biphenoxybenzoyl)benzene, 1,3-bis(4-amino-5-biphenoxybenzoyl)benzene, 1,4-bis(4-amino-5-biphenoxybenzoyl)benzene, 2,6-bis[4-(4-amino-α,α-dimethylbenzyl)phenoxy]benzonitrile, an aromatic diamine in which a part or all of the hydrogen atoms on the aromatic ring of the above-mentioned aromatic diamine is substituted with a halogen atom, an alkyl group or alkoxyl group with 1 to 3 carbon atoms, a cyano group, or a halogenated alkyl group or alkoxyl group with 1 to 3 carbon atoms allowing a part or all of the hydrogen atoms of the alkyl group or alkoxyl group to be substituted with a halogen atom, and the like.

<Aromatic Tetracarboxylic Acid Anhydride>

No particular restriction is put on a tetracarboxylic acid used in the present invention, and aromatic tetracarboxylic acids, aliphatic tetracarboxylic acids, alicyclic tetracarboxylic acids, acid anhydrides thereof, and the like which are usually used for synthesizing a polyimide can be used. Of these, aromatic tetracarboxylic acid anhydrides, aliphatic tetracarboxylic acid anhydrides, and alicyclic tetracarboxylic acid anhydrides are preferred, and aromatic tetracarboxylic acid anhydrides are more preferred. In the case where these are acid anhydrides, although one anhydride structure may be contained or two anhydride structures may be contained in its molecule, one having two anhydride structures (a dianhydride) is preferred. Although the aromatic tetracarboxylic acid anhydride is not particularly limited, one having a pyromellitic acid residue, namely, a structure derived from pyromellitic acid, is preferred. Specifically, examples of the aromatic tetracarboxylic acid anhydride include the following ones.

[Chemical Formula 14]

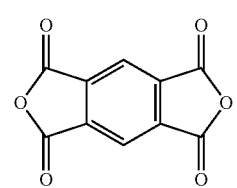

Pyromellitic acid anhydride

[Chemical Formula 15]

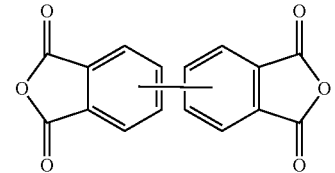

3,3',4,4'-Biphenyltetracarboxylic acid anhydride

[Chemical Formula 16]

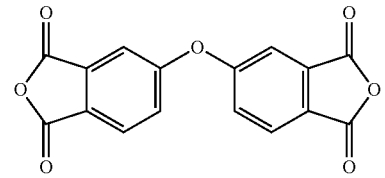

4,4'-Oxydiphthalic acid anhydride

[Chemical Formula 17]

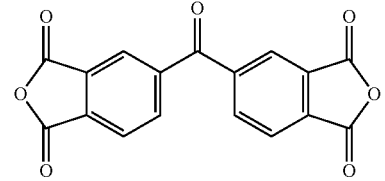

3,3',4,4'-Benzophenonetetracarboxylic acid anhydride

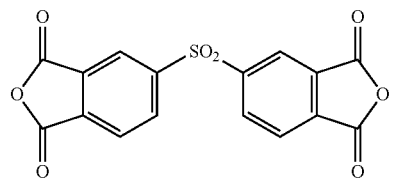

3,3',4,4'-Diphenylsulfonetetracarboxylic acid anhydride

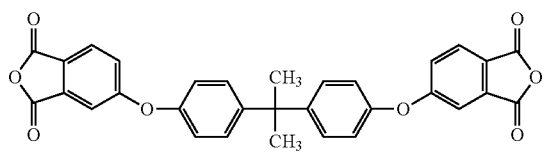

2,2-Bis[4-(3,4-dicarboxyphenoxy)phenyl]propanoic anhydride

These tetracarboxylic acid dianhydrides may be used alone or may be used in combination of two or more thereof.

Although the solvent used for obtaining a polyamic acid by allowing an aromatic tetracarboxylic acid and an aromatic diamine to undergo a reaction (polymerization) is not particularly limited as long as the solvent is one which dissolves both of the monomer as a raw material and the polyamic acid to be produced, a polar organic solvent is preferred, and examples thereof include N-methyl-2-pyrrolidone, N-acetyl-2-pyrrolidone, N,N-dimethylformamide, N,N-diethylformamide, N,N-dimethylacetamide, dimethyl sulfoxide, hexamethyl phosphoric amide, ethyl cellosolve acetate, diethylene glycol dimethyl ether, sulfolane, halogenated phenols, and the like. These solvents may be used alone or may be used as a mixture. The amount of the solvent used may be an amount sufficient for dissolving the monomer as a raw material. Specifically, the amount thereof to be used may be usually an amount allowing the weight proportion of the monomer in a solution in which the monomer is dissolved to be 5 to 40% by weight, preferably 10 to 30% by weight.

As the conditions of a polymerization reaction for obtaining a polyamic acid (hereinafter, merely referred to also as "a polymerization reaction"), conventionally known conditions may be applied, and specific examples thereof include stirring and/or mixing in an organic solvent continuously for 10 minutes to 30 hours in a temperature range of 0 to 80° C. The polymerization reaction may be divided and the temperature may be raised or lowered, as necessary. In this case, although no particular restriction is put on the order for adding both the monomers, it is preferred that an aromatic tetracarboxylic acid anhydride be added to a solution of an aromatic diamine. The weight proportion of the polyamic acid in a polyamic acid solution obtained by a polymerization reaction is preferably 5 to 40% by weight and more preferably 10 to 30% by weight, and the viscosity of the solution measured with a Brookfield viscometer (25° C.) is preferably 10 to 2000 Pa·s and more preferably 100 to 1000 Pa·s from the point of stability for liquid feeding.

Performing vacuum defoaming during the polymerization reaction is effective in producing a good quality polyamic acid solution. Moreover, prior to the polymerization reaction, a small amount of a terminal sealing agent may be added to an aromatic diamine to control the polymerization. Examples of the terminal sealing agent include a compound having a carbon-carbon double bond such as maleic acid anhydride. In the case where maleic acid anhydride is used, the amount thereof to be used is preferably 0.001 to 1.0 mol per 1 mol of an aromatic diamine.

Examples of a method for forming a polyimide film from a polyamic acid solution obtained by the polymerization reaction include a method of applying a polyamic acid solution to a support and drying the coating film to obtain a green film (a self-supporting precursor film), and then subjecting the green film to a heat treatment to be allowed to undergo an imidization reaction. Although application of the polyamic acid solution to the support includes casting from a spinneret with a slit, extruding by an extruder, and the like, the application is not limited thereto and conventionally known means for applying a solution may be appropriately used.

The base film for preparing the polyimide film in the present invention is a multilayer polyimide film including at least two layers of an (a) layer and a (b) layer, and a face at the (b) layer side constitutes the face opposite to a support. The (a) layer and the (b) layer are both polyimide layers, and the (a) layer contains a slip agent and the (b) layer is free from a slip agent. In this context, being free from a slip agent refers to containing no slip agent at all or containing a slip agent in an amount less than or equal to 0.2% by mass. Being free from a slip agent preferably refers to containing a slip agent in an amount less than or equal to 0.1% by mass, and further preferably refers to containing a slip agent in an amount less than or equal to 0.05% by mass. It is more preferred that the (a) layer be a layer which contains a slip agent material (particles) with an average particle diameter of 0.05 to 2.5 μm in an amount of 0.4% by mass to 50% by mass and is made mainly of a polyimide obtained by allowing an aromatic tetracarboxylic acid and an aromatic diamine to undergo a reaction, and it is more preferred that the (b) layer be a layer which contains no slip agent material (particles) with an average particle diameter of 0.05 to 2.5 μm at all or has a content thereof less than or equal to 0.2% by mass and is made mainly of a polyimide obtained by allowing an aromatic tetracarboxylic acid and an aromatic diamine to undergo a reaction.

The multilayering (stacking) method of this multilayer polyimide film is not particularly limited as long as there occurs no problem on adhesion between both the layers and the method needs only to be one that brings the layers into close contact with each other without other layers, for example, an adhesive agent layer, interposed therebetween. Examples thereof include a method of preparing one polyimide film, then continuously applying a polyamic acid solution for the other layer on the polyimide film and imidizing the film, a method of casting a polyamic acid solution for one layer to prepare a polyamic acid precursor film, then continuously applying a polyamic acid solution for the other layer to the polyamic acid film, and imidizing the film, a method by coextrusion, a method of applying a polyamic acid solution for the (a) layer to the above-mentioned (b) layer by spray coating, T-die coating, or the like and imidizing the film, and the like. Among the above-mentioned methods, a method of casting a polyamic acid solution for one layer to prepare a polyamic acid precursor film, then continuously applying a polyamic acid solution for the other layer to the polyamic acid film, and imidizing the film, or a method of preparing one polyimide film, then continuously applying a polyamic acid solution for the other layer to the polyimide film, and imidizing the film is preferred. Moreover, with regard to the multilayer configuration, the (a) layer is stacked on the (b) layer. Although the thickness ratio of (a)/(b) in the multilayer polyimide film of the present invention is not particularly limited, the thickness ratio of (a)/(b) ((a)/(b)) is preferably 0.05 to 0.95. When the thickness ratio of (a)/(b) exceeds 0.95, the smoothness of the (b) layer is often lost, and on the other hand, in the case where the thickness ratio is less than 0.05, the easy slipping properties are frequently lost due to a lack of the improvement effect on surface characteristics.

In the multilayer polyimide film, since one layer (a layer) ensures handling properties and productivity, it is preferred that, by allowing the above-mentioned slip agent material to be added to and contained in the polyimide and imparting the layer (film) surface with fine unevenness, the slipping properties be ensured by the layer (film).

In order to ensure the slipping properties of the polyimide film by imparting the surface with fine unevenness, the polyimide forming the (a) layer as one layer is required to contain a slip agent in an amount within a range of 0.4 to 50% by mass, and the range is preferably 0.5 to 3% by mass and more preferably 0.5 to 1.0% by mass. When the content of the slip agent material is small, it is not preferred because the slipping properties of the layer (film) surface are not sufficiently ensured. On the other hand, when the content of the slip agent material is too large, the surface unevenness becomes too large and it is not preferred because there are still problems that, even if the slipping properties of the layer (film) surface are appreciably ensured, the lowering in smoothness is caused, the lowering in breaking strength and breaking elongation of the polyimide film is caused, an increase in CTE is caused, and the like.

Although the thickness of the polyimide layered product in the present invention is not particularly limited, the thickness is preferably 1 μm to 200 μm and further preferably 3 μm to 60 μm. Also, it is preferred that the thickness unevenness of these polyimide films be a value less than or equal to 20%. In the case where the thickness is less than or equal to 1 μm, the thickness control is difficult and it becomes difficult to peel off the polyimide film from a substrate made from an inorganic substance. In the case where the thickness is greater than or equal to 200 μm, bending of the polyimide film or the like easily occurs when the polyimide film is peeled off. Using these polyimide films greatly contributes to attaining advancement in performance of an element such as a sensor and attaining a light, small, short and thin electronic component.

The slip agent material (particles) in the present invention refers to fine particles of an inorganic substance with a volume average particle diameter of 0.001 to 10 μm. For the slip agent material (particles), particles of a metal, a metal oxide, a metal nitride, a metal carbide, an acid metal salt, a phosphate salt, a carbonate salt, talc, mica, clay, other clay minerals, and the like can be used, and a metal oxide, a phosphate salt and a carbonate salt such as silicon oxide, calcium phosphate, calcium hydrogen phosphate, calcium dihydrogen phosphate, calcium pyrophosphate, hydroxyapatite, calcium carbonate, and glass filler can be preferably used.

As the polyimide film in the present invention, a wound product of a long polyimide film with a width greater than or equal to 300 mm and a length greater than or equal to 10 m at the time of being produced is preferred, and a rolled polyimide film wound around a winding core is more preferred.

The polyimide layered product of the present invention is a layered product having a structure of at least three layers in which a varnish layer is included on the above-mentioned multilayer polyimide film including at least the two layers, an (a) layer and a (b) layer, and both surface layers are free from a slip agent. In this context, being free from a slip agent refers to containing no slip agent at all or containing a slip agent in an amount less than or equal to 0.2% by mass. The (a) layer, the (b) layer and the varnish layer are each a polyimide layer, and the (a) layer contains a slip agent and the (b) layer and the varnish layer are free from a slip agent. The present inventors have found that, on performing the multilayering (stacking) procedure of this polyimide layered product, when a varnish is simply applied to and stacked on a polyimide film, there occurs a problem on adhesion between the polyimide film and the varnish layer, and have completed the means for improving the adhesive properties utilizing an organic alkali treatment described below.

As the means for improving the adhesive properties between a polyimide film and a varnish layer, with regard to the polyimide film, it is necessary to treat the polyimide film surface with an organic alkali solution. The organic alkali treatment in the present invention refers to treating a polyimide surface with an organic alkali solution, and also includes subjecting a polyimide surface after subjected to an organic alkali treatment to an acid treatment.

As the organic alkali solution, an aqueous quaternary ammonium hydroxide solution is preferably used. Preferable specific examples of the quaternary ammonium hydroxide include tetramethylammonium hydroxide (TMAH), tetraethylammonium hydroxide, and tetrapropylammonium hydroxide, from the points of satisfactory handling properties and easy availability on an industrial scale. Of these, TMAH is more preferred. These compounds are easily available usually as a 10 to 25% by weight aqueous solution. These may be used directly or may be concentrated to a concentration of approximately 30 to 50% by weight on a rotary evaporator and the like before use.

To the aqueous quaternary ammonium hydroxide solution, a solvent such as DMSO (dimethyl sulfoxide) and IPA (2-propanol) may be added. In the case where NMP (N-methyl-2-pyrrolidone) or DMF (N,N-dimethylformamide) was used, precipitation occurred at the time of preparing a mixed solution.

Moreover, as the water to be used, deionized water free from components (halogen ions, alkali metal ions, and the like) that adversely affect the electronic component is preferred.

The acid treatment can be performed by immersing a polyimide film subjected to an organic alkali treatment in a chemical liquid containing an acid or applying or spraying the chemical liquid to a polyimide film subjected to an organic alkali treatment. In this case, ultrasonic washing and the like may be combinedly used therewith. Moreover, by subjecting a polyimide film to an acid treatment in a state where a protective film is stuck on one surface of the polyimide film, it is possible to subject only one surface thereof to an acid treatment. As the protective film, a PET film with a tackiness agent, an olefin film, and the like can be used.

As the acid used in the acid treatment, any acid can be used. Examples of such an acid include inorganic acids, sulfonic acids, and carboxylic acids, and hydrochloric acid, sulfuric acid, formic acid, nitric acid, permanganic acid, hydrogen peroxide, phosphoric acid, a sulfonic acid, and an amino acid are preferred. The kind of the acid and the acid concentration in the chemical liquid need only to be those sufficient for removing the organic alkali treatment liquid. The acid concentration in the chemical liquid is preferably less than or equal to 20% by mass and more preferably 3 to 10% by mass.

The organic alkali treatment can be performed by immersing a polyimide film in a chemical liquid containing an organic alkali solution or applying or spraying the chemical liquid to a polyimide film. It is preferred that the organic alkali treatment solution be removed after the organic alkali treatment. More specifically, the treatment can be performed by immersing a polyimide film in a chemical liquid containing an organic alkali solution and then washing the polyimide film with water, or applying or spraying the chemical liquid to a polyimide film and then removing the chemical liquid with water.

Since the polyimide constituting the polyimide film is hydrolyzed and functional groups are formed on the polyimide film surface by the above-mentioned organic alkali solution treatment, it is considered that the adhesivity to the varnish layer is enhanced.

Examples of a method for stacking a varnish layer after the treatment with an organic alkali solution include a method of preparing a polyimide film having a two-layered structure, then continuously applying a varnish layer solution (polyamic acid) to the polyimide film and imidizing the film, a method by coextrusion, and a method of applying a polyamic acid solution for the varnish layer to the (a) layer of a two-layered polyimide film by spray coating, T-die coating, or the like and imidizing the film in the case where a layer made mainly of the polyimide obtained by allowing an aromatic tetracarboxylic acid and an aromatic diamine to undergo a reaction is employed. A method of casting a polyamic acid solution for the two-layered polyimide film preparation to prepare a polyamic acid precursor film, then continuously applying a varnish layer solution (polyamic acid solution) to the polyamic acid film and imidizing the film, and a method of preparing a two-layered polyimide film, then continuously applying a varnish layer solution (polyamic acid solution) for the other layer to the polyimide film and imidizing the film are preferred.

The varnish layer used for preparing the polyimide layered product of the present invention is one constituting a layer of a polyimide obtained by applying a varnish layer solution and drying the coating film. Here, the varnish layer solution is a polyamic acid (polyimide precursor) solution obtained by allowing a diamine and a tetracarboxylic acid anhydride to undergo a reaction in a solvent as described above. The varnish layer is obtained by applying the varnish layer solution to a polyimide film, drying the coating film to prepare a green film (also referred to as a precursor film or a polyamic acid film), and furthermore, subjecting the green film on a two-layered polyimide film to a high-temperature heat treatment to perform a dehydrative ring-closing reaction.

The interface in this patent means an interface visually confirmed at the time of observing a cross-sectional configuration of a polyimide film prepared by being subjected to an organic alkali treatment and being coated with a varnish layer, that is, a polyimide layered product, with a differential interference microscope described below.

By subjecting a polyimide to an organic alkali treatment, the peel strength is greatly enhanced. On the polyimide surfaces of the polyimide layered products 1, 2 and 3 subjected to an organic alkali treatment, imide decomposition products are generated and chemical composition change occurs, and at the same time, the surface roughness is also reduced. Taking these points into consideration, it is considered that the peel strength is enhanced by the chemical bond rather than an anchor effect.

With regard to the polyimide layered product surface subjected to an organic alkali treatment, as compared to a polyimide layered product surface not subjected to an organic alkali treatment, the absorption considered to be derived from the ester bond of —COOH or derived from the —NH2 bond has been confirmed in addition to the absorption derived from the OH group. The imide bond is opened by an organic alkali treatment to produce —COOH and —NH2. At this time, it is presumed that the modified polyimide constituting the interface is observed. Since the polyimide becomes a polyamic acid and the affinity with the varnish is enhanced, it is considered that the peel strength is enhanced by allowing the imide bond to be re-formed.

Examples of the polyimide layered product with the support according to the present invention include a polyimide layered product with a support, in which a support and a polyimide layered product are stacked with a coupling-treated layer interposed therebetween, a satisfactorily bondable part and an easily releasable part which differ in peel strength between the support and the polyimide layered product are included since the coupling layer is subjected to patterning, and the polyimide layered product is a layered product having a structure of at least three layers in which at least one layer contains a slip agent and both surface layers have no slip agent. Examples of the method for producing a polyimide layered product with a support according to the present invention include a method for producing a polyimide layered product with a support including at least the support and the polyimide layered product, the polyimide layered product being a layered product having a structure of at least three layers in which at least one layer contains a slip agent and both surface layers have no slip agent, including: preparing a polyimide film with a face opposite to the support and subjected to a surface treatment; subjecting at least one of a face of the support and the face of the polyimide film which are opposite to each other to a patterning treatment using a coupling agent to form a satisfactorily bondable part and an easily releasable part which differ in adhesion/peel strength; subsequently, superposing the support and the polyimide film to be subjected to a pressurizing/heating treatment; subjecting the polyimide film to an organic alkali treatment after the polyimide film is bonded to the support by the heating/pressurizing treatment; and then, applying a polyamic acid solution (A) free from a slip agent ingredient, drying the coating film and imidizing the film.

One example of the method for producing a layered product of the present invention includes a method of using a polyimide film in which no slip agent material or a small amount, less than or equal to 0.2%, of a slip agent material is incorporated in one surface thereof as a raw material, applying a coupling agent to the slip agent material-free surface to obtain an adhesion surface, and preparing a layered product together with a substrate made from an inorganic substance.

The coupling agent preferably used in the method for producing a layered product of the present invention is physically or chemically interposed between a support and a polyimide film (or a polyimide layered product) and means a compound having an action of enhancing the adhesive force between the two. In general, examples thereof include a compound known as a silane-based coupling agent, a phosphorus-based coupling agent, a titanate-based coupling agent, or the like. Although the coupling agent is not particularly limited, one having an amino group or an epoxy group is preferred. Specific examples of the coupling agent include N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-(1,3-dimethyl-butylidene)propylamine, 2-(3,4-epoxycyclohexyl)ethyltrimethoxysilane, 3-glycidoxypropyltrimethoxysilane, 3-glycidoxypropylmethyldiethoxysilane, 3-glycidoxypropyltriethoxysilane, vinyl trichlorosilane, vinyl trimethoxysilane, vinyl triethoxysilane, 2-(3,4-epoxycyclohexyl)ethyltrimethoxysilane, 3-glycidoxypropyltrimethoxysilane, 3-glycidoxypropylmethyldiethoxysilane, 3-glycidoxypropyltriethoxysilane, p-styryltrimethoxysilane, 3-methacryloxypropylmethyl dimethoxysilane, 3-methacryloxypropyltrimethoxysilane, 3-methacryloxypropylmethyldiethoxysilane, 3-methacryloxypropyltriethoxysilane, 3-acryloxypropyltrimethoxysilane, N-phenyl-3-aminopropyltrimethoxysilane, N-(vinylbenzyl)-2-aminoethyl-3-aminopropyltrimethoxysilane hydrochloride, 3-ureidopropyltriethoxysilane, 3-chloropropyltrimethoxysilane, 3-mercaptopropylmethyldimethoxysilane, 3-mercaptopropyltrimethoxysilane, bis(triethoxysilylpropyl)tetrasulfide, 3-isocyanatepropyltriethoxysilane, tris-(3-trimethoxysilylpropyl)isocyanurate, chloromethylphenethyltrimethoxysilane, chloromethyltrimethoxysilane and the like.

Other examples of the usable coupling agent include 1-mercapto-2-propanol, methyl 3-mercaptopropionate, 3-mercapto-2-butanol, butyl 3-mercaptopropionate, 3-(dimethoxymethylsilyl)-1-propanethiol, 4-(6-mercaptohexaloyl)benzyl alcohol, 11-amino-1-undecenethiol, 11-mercaptoundecyl phosphonic acid, 11-mercaptoundecyl trifluoroacetic acid, 2,2'-(ethylenedioxy)diethanethiol, 1-mercaptoundecyl tri(ethylene glycol), (1-mercaptoundec-1-yl)tetra(ethylene glycol), 1-(methylcarboxy)undec-11-yl) hexa(ethylene glycol), hydroxyundecyl disulfide, carboxyundecyl disulfide, hydroxyhexadodecyl disulfide, carboxyhexadecyl disulfide, tetrakis(2-ethylhexyloxy) titanium, titanium dioctyloxy bis(octylene glycolate), zirconium tributoxy monoacetylacetonate, zirconium monobutoxy acetylacetonate bis(ethylacetoacetate), zirconium tributoxy monostearate, acetoalkoxy aluminum diisopropylate, and the like.

Among these, examples of a preferred coupling agent include N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-(1,3-dimethyl-butylidene)propylamine, 2-(3,4-epoxycyclohexyl)ethyltrimethoxysilane, 3-glycidoxypropyltrimethoxysilane, 3-glycidoxypropylmethyldiethoxysilane, 3-glycidoxypropyltriethoxysilane, aminophenyltrimethoxysilane, aminophenethyltrimethoxysilane, aminophenyl aminomethylphenethyl trimethoxysilane, and the like. In the case where heat resistance is required in the process, one in which Si and an amino group are connected via an aromatic ring is desirable.

In a method for stacking a substrate made from an inorganic substance and a polyimide film using an extremely thin heat-resistant layer, namely, coupling, in place of an adhesive agent layer at the time of stacking the substrate and the polyimide film without the adhesive agent layer interposed therebetween, which can be preferably employed in the production of the polyimide layered product with the support according to the present invention, as a method of subjecting a substrate to a coupling agent treatment to form a coupling-treated layer, a method of applying a solution of a coupling agent to a substrate made from an inorganic substance, drying the coating film, and performing a heat treatment, a method of immersing a polyimide film in a solution of a coupling agent, then drying the coating film, and performing a heat treatment, and a method of adding a coupling agent to a polyimide film at the time of the polyimide film preparation and simultaneously performing the polyimide film preparation and the coupling agent treatment can be mentioned. Moreover, it is known that the pH during the process largely affects the performance, and the pH should be appropriately adjusted. The application amount (the adhesion amount or the content) of a coupling agent should be appropriately set so that a coupling agent-treated layer formed has the film thickness described below. With regard to the conditions for the heat treatment, the coating film should be heated preferably at a temperature of 50 to 250° C., more preferably 75 to 165° C. and further preferably approximately 95 to 155° C., preferably for a period greater than or equal to 30 seconds, more preferably for a period greater than or equal to 2 minutes, and further preferably for a period greater than or equal to 5 minutes.

Examples of the support in the present invention include one formed mainly of a glass plate, a ceramic plate, a silicon wafer or a metal, and as a composite made from the glass plate, the ceramic plate, the silicon wafer and the metal, one prepared by stacking them, one prepared by allowing them to be dispersed in the support, one containing fibers thereof, or the like.

Examples of the glass plate as the support in the present invention include quartz glass, high silicate glass (96% silica), soda-lime glass, lead glass, aluminoborosilicate glass, borosilicate glass (Pyrex (registered trademark)), borosilicate glass (alkali-free), borosilicate glass (microsheet), and aluminosilicate glass. Of these, one with a coefficient of linear thermal expansion less than or equal to 5 ppm/° C. is desirable, and Corning 7059, 1737 or EAGLE as glass for liquid crystal, AN100 available from ASAHI GLASS CO., LTD., OA10 available from Nippon Electric Glass Co., Ltd., AF32 available from SCHOTT Nippon K.K., NA32SG available from AvanStrate Inc., and the like are desirable.

Examples of the ceramic plate as the support in the present invention include ceramics for substrate such as $Al_2O_3$, Mullite, AlN, SiC, $Si_3N_4$, BN, crystallized glass, Cordierite, Spodumene, Pb-BSG+$CaZrO_3$+$Al_2O_3$, Crystallized glass+$Al_2O_3$, Crystallized Ca-BSG, BSG+Quartz, BSG+Quartz, BSG+$Al_2O_3$, Pb+BSG+$Al_2O_3$, Glass-ceramic and Zerodur material; capacitor materials such as $TiO_2$, strontium titanate, calcium titanate, magnesium titanate, alumina, MgO, steatite, $BaTi_4O_9$, $BaTiO_3$, $BaTi_4$+$CaZrO_3$, $BaSrCaZrTiO_3$, $Ba(TiZr)O_3$, PMN-PT and PFN-PFW; and piezoelectric materials such as $PbNb_2O_6$, $Pb_{0.5}Be_{0.5}Nb_2O_6$, $PbTiO_3$, $BaTiO_3$, PZT, 0.855PZT-0.95PT-0.5BT, 0.873PZT-0.97PT-0.3BT and PLZT.

Examples of the silicon wafer as the support in the present invention include an n-type or p-type doped silicon wafer and all of intrinsic silicon wafers, and moreover, a silicon wafer on the surface of which a silicon oxide layer and various thin films are deposited is also included. In addition to the silicon wafer, germanium, silicon-germanium, gallium-arsenic, aluminum-gallium-indium and nitrogen-phosphorus-arsenic-antimony are frequently used. General-purpose semiconductor wafers such as InP (indium phosphide), InGaAs, GaInNAs, LT, LN, ZnO (zinc oxide), CdTe (cadmium tellurium) and ZnSe (zinc selenide) are also mentioned.

Examples of the metal as the support in the present invention include single elemental metals such as W, Mo, Pt, Fe, Ni and Au, and alloys such as Inconel, Monel, Nimonic, carbon copper, an Fe—Ni based invar alloy and a super invar alloy. Examples thereof also include a multilayer metal plate prepared by adding other metal layers and ceramic layers to the above-mentioned metal. In this case, when the CTE of the whole layer including the additional layer is low, Cu, Al and the like are also used for the main metal layer. Although the metal used as an additional metal layer is not limited as long as the metal is one that allows the adhesive properties to the polyimide film to be strengthened or one that has characteristics of not causing the diffusion, being satisfactory in chemical resistance and heat resistance, and the like, preferred examples thereof include chromium, nickel. TiN and Mo-containing Cu.

It is desirable that the planar portion of the support be sufficiently flat. The P-V value of the surface roughness is a value less than or equal to 50 nm, further desirably a value less than or equal to 20 nm, and more desirably a value less than or equal to 5 nm. When the surface is rougher than this, the peel strength between the polyimide film and the substrate made from an inorganic substance is lowered.

Although the surface treatment for the polyimide film used in the present invention is not particularly limited, examples thereof include a plasma treatment, a wet treatment, a gas treatment, and an energy ray irradiation treatment. It is important that at least the face opposite to the support of the polyimide film be subjected to a surface treatment. By subjecting the face to a surface treatment, the polyimide film surface is modified into a state of allowing functional groups to be present thereon (a so-called activated state), and the satisfactory adhesion to the support can be attained. Of these, the plasma treatment is preferably used.

Although the plasma treatment as one of surface treatments to the polyimide film used in the present invention is not particularly limited, examples thereof include an RF plasma treatment in vacuum, a microwave plasma treatment, a microwave ECR plasma treatment, an atmospheric pressure plasma treatment, a corona treatment, and the like, and a fluorine-containing gas treatment, an ion implanting treatment using an ion source, a treatment using a PBII method, a flame treatment, an Itro treatment, and the like are also included. Of these, an RF plasma treatment in vacuum, a microwave plasma treatment, and an atmospheric pressure plasma treatment are preferred.

The effects of the plasma treatment include the addition of surface functional groups, the variation of the contact angle associated with this, the enhancement in adhesivity, the removal of the surface contaminant, and the like, and further include an effect of etching the surface such as the removal of irregularly shaped objects associated with the process which is called a desmear treatment. In particular, since the polymer and the ceramic completely differ in ease of etching, it follows that only the polymer which is lower in binding energy than the ceramic is selectively etched. As such, by the gas species with an etching action, under the discharge condition, only the polymer is selectively etched and an action of allowing a slip agent material (referred to as particles or filler) to be exposed is also generated. This polyimide film can be produced by combinedly using one prepared by adding a slip agent material to a polyamic acid solution for polyimide formation (polyimide precursor solution) and one prepared by adding no slip agent material or only an extremely small amount thereof to the solution. The polyimide film is also imparted with roll windability and moderate slipping properties on the polyimide film formation and this facilitates the polyimide film production.

In the formation method of a layered product of the present invention, after the coupling agent treatment, a part of the coupling agent-treated layer is subjected to a deactivation treatment to form a prescribed pattern. This is referred to as a patterning treatment, and it is possible to intentionally produce a part strong and a part weak in adhesion/peel strength between the support and the polyimide film. In this connection, subjecting a coupling agent-treated layer to a deactivation treatment includes physically partially removing a coupling agent-treated layer (so-called etching), physically microscopically masking a coupling agent-treated layer, and chemically modifying a coupling agent-treated layer.

As the deactivation treatment, at least one kind of treatment selected from the group consisting of a blast treatment, a vacuum plasma treatment, an atmospheric pressure plasma treatment, a corona treatment, an active radiation irradiation treatment, an active gas treatment and a chemical liquid treatment can be used.

The blast treatment refers to a treatment of spraying particles with an average particle diameter of 0.1 to 1000 μm together with a gas or a liquid to an object. In the present invention, it is preferred that a blast treatment using particles with a small average particle diameter within a possible range be employed.

The vacuum plasma treatment refers to a treatment of exposing an object to the plasma generated by a discharge in a gas under reduced pressure or colliding ions generated by the discharge against an object. As the gas, neon, argon, nitrogen, oxygen, carbon fluoride, carbon dioxide, hydrogen and the like may be used alone or a mixed gas thereof may be used.

The atmospheric pressure plasma treatment refers to a treatment of exposing an object to the plasma generated by a discharge generated in a gaseous matter atmosphere under almost atmospheric pressure or colliding ions generated by the discharge against an object. As the gaseous matter, neon, argon, nitrogen, oxygen, carbon dioxide, hydrogen and the like may be used alone or a mixed gas thereof may be used.

The corona treatment refers to a treatment of exposing an object to the corona discharge atmosphere generated in a gaseous matter atmosphere under almost atmospheric pressure or colliding ions generated by the discharge against an object.

The active radiation irradiation treatment refers to a treatment of irradiating an object with a radiation such as an electron beam, alpha rays, X-rays, beta rays, infrared rays, visible light rays, and ultraviolet rays. In this connection, in the case of performing a laser light irradiation treatment, performing a treatment with a direct drawing system is particularly facilitated. In this connection, in this case, even a visible light laser beam can be handled as a kind of active radiation in the present invention since the laser beam has an energy far larger than a general visible light ray.

The active gas treatment refers to a treatment of exposing an object to a gaseous matter having an activating action for causing the coupling agent-treated layer to be chemically or physically modified such as a halogen gas, a hydrogen halide gas, ozone, a high-concentration oxygen gas, and a gas of ammonia, an organic alkali, an organic acid, or the like. The chemical liquid treatment refers to a treatment of exposing an object to a liquid or a solution having an activating action for causing the coupling agent-treated layer to be chemically or physically modified such as an alkali solution, an acid solution, a reducing agent solution, and an oxidizing agent solution.

As the means for selectively subjecting a part of the coupling agent-treated layer to a deactivation treatment to form a prescribed pattern, a part thereof corresponding to the prescribed pattern may be temporarily covered or shielded with a mask to subject the whole surface to etching and the like and then remove the mask, and if possible, etching and the like may be performed along the pattern with a direct drawing system. As the mask, a mask commonly used as a resist, a photomask, a metal mask, or the like may be appropriately selected according to the etching method.

In the present invention, particularly from the viewpoint of productivity, among such treatments, a method combining the active radiation and the mask is preferably used. As an active radiation treatment, from the viewpoints of economy and safety, an ultraviolet ray irradiation treatment, that is, a UV irradiation treatment is preferred.

Moreover, in a UV treatment, in the case where one having UV permeability is selected as the inorganic layer, the UV irradiation can also be performed with a direct drawing system or via a mask from a face reverse to the face of the inorganic layer which has been subjected to the coupling agent treatment. From the above, in the present invention, it is preferred that the deactivation treatment be performed by UV irradiation, and hereinafter, the treatment will be described in detail.

The UV irradiation treatment in the present invention is a treatment of placing a polyimide film and/or a substrate made from an inorganic substance which have been subjected to a coupling agent treatment in an apparatus in which an ultraviolet ray with a wavelength less than or equal to 400 nm is generated, and performing UV irradiation. The UV light wavelength is desirably a wavelength less than or equal to 260 nm, and further desirably, a wavelength less than or equal to 200 nm is included. However, since the absorption of the UV light by oxygen is remarkable in the case of a wavelength less than or equal to 170 nm, it is necessary to take into consideration measures for allowing the UV light to reach the coupling agent layer. In the case of the irradiation in an atmosphere completely free from oxygen, since the surface modification effect to be exerted by reactive oxygen species and ozone is not developed, it is necessary to devise methods for allowing the UV light to pass and allowing reactive oxygen species and ozone to also reach the coupling agent layer. Such a plan that the distance from the quartz glass to the coupling agent layer is shortened to suppress the absorption of the UV light by devising an apparatus, for example, arranging a UV light source in a nitrogen atmosphere, allowing the UV light to transmit the quartz glass, and allowing the UV light to strike the coupling agent layer, has been known. A method of controlling the absorption of the UV light by oxygen by making the amount of oxygen in the atmosphere a controlled amount thereof in place of the normal atmosphere, controlling the flow of a gaseous matter between the UV light source and the coupling agent layer, and the like are measures to be taken first as a method for controlling the transmission of the UV light and the amount of ozone generated. By intentionally producing a part irradiated with light and a part not irradiated therewith, a pattern is formed. As the formation method, a method of forming a pattern by producing a part shielded from UV light and a part not shielded from UV light or scanning with UV light, and the like are acceptable. In order to make the shape of the end part of a pattern clear, cutting off the UV light and covering the substrate made from an inorganic substance with a shielding object are effective. Moreover, scanning with a parallel light beam of the UV laser is also effective. As the intensity of the UV light, a value greater than or equal to 5 mW/cm$^2$ is desirable. For preventing deterioration of glass, a value less than or equal to 200 mW/cm$^2$ is desirable. The irradiation time is preferably 0.1 minute to 30 minutes, more preferably 0.5 to 10 minutes, and more preferably 1 minute to 4 minutes.

Examples of a light source that can be used for a UV exposure treatment include an excimer lamp, a low pressure mercury lamp, a high pressure mercury lamp, an Xe excimer laser, an ArF excimer laser, a KrF excimer laser, an Xe lamp, an XeCl excimer laser, an XeF excimer laser, an Ar laser, a D2 lamp, and the like. Of these, an excimer lamp, a low pressure mercury lamp, an Xe excimer laser, an ArF excimer laser, a KrF excimer laser, and the like are preferred.

The satisfactorily bondable part in the present invention refers to a part strong in peel strength between a substrate made from an inorganic substance and a polyimide film, which is formed by allowing the properties of the surface to be changed depending on the presence or absence of the UV light irradiation. Then, the easily releasable part in the present invention refers to a part weak in peel strength between a substrate made from an inorganic substance and a polyimide film, which is formed by allowing the properties of the surface to be changed depending on the presence or absence of the UV light irradiation. The respective values of the required peel strength differ depending on the respective processes. However, in general terms, the 180-degree peel strength of the satisfactorily bondable part between the polyimide film of the layered product and the substrate made from an inorganic substance is greater than or equal to 0.5 N/cm and less than or equal to 5 N/cm, and more preferably greater than or equal to 0.8 N/cm and less than or equal to 2 N/cm. The 180-degree peel strength of the easily releasable part is less than or equal to one-half of the 180-degree peel strength of the satisfactorily bondable part and greater than or equal to 0.01 N/cm and less than or equal to 0.40 N/cm, and more preferably less than or equal to one-fifth of the 180-degree peel strength thereof and greater than or equal to 0.01 N/cm and less than or equal to 0.2 N/cm. However, the lower limit of the peel strength of the easily releasable part is a value taking the bending energy of the polyimide film and the like into account. Moreover, although each of the heat-resistant peel strength and the acid-resistant peel strength is also desirably greater than or equal to 0.5 N/cm and less than or equal to 5 N/cm, this demanded number may vary depending on each of the processes.

In the present invention, the pressurizing/heating treatment preferably used at the time of stacking a polyimide film on a substrate made from an inorganic substance refers to pressing, laminating and roll lamination, each of them is performed with heating, and desirably, these operations are performed in a vacuum. A system such as pressing in a vacuum, for example, pressing with the 11 FD available from Imoto machinery Co., Ltd., and vacuum laminating with a roll type vacuum film laminator or a film laminator in which the whole surface of glass can be pressurized at one time by a rubber thin film under vacuum, for example, the MVLP available from MEIKI CO., LTD., can be used.

As an application example in the present invention, a hole part penetrating the polyimide film or the layered product in the polyimide film layered product in the film thickness direction may be bored therein to be provided with a non-polyimide part. Although the hole part is not a part particularly limited, preferable examples thereof include one filled with a metal composed mainly of a metal such as Cu, Al, Ag and Au, an empty hole formed by a mechanical type drill or laser beam drilling, and one in which a metal film is formed on the wall surface of the empty hole by sputtering, seed layer formation by electroless plating, or the like.

In the polyimide film layered product of the present invention, no adhesive agent layer is interposed between the support and the polyimide film, and only the coupling-treated layer containing greater than or equal to 10% by weight of Si derived from the coupling agent is interposed therebetween. Since an intermediate layer can be made thin by the use of the coupling agent layer, the following effects are exerted: the degassed gas component during heating is small in amount, the elution hardly occurs even in a wet process, and even if the elution occurs, the elution amount is minute. However, a layer derived from the coupling agent is rich in a silicon oxide component and has heat resistance at a temperature of approximately 400° C. The thickness of this layer derived from the coupling agent lies within a range less than 0.4 μm and becomes a thickness less than or equal to approximately 0.2 μm when usually prepared, and the range to be employed is less than or equal to 100 nm (less than or equal to 0.1 μm), desirably less than or equal to 50 nm, and further desirably 10 nm. In a process in which the amount of the coupling agent is desirably as small as possible, even when the layer has a thickness less than or equal to 5 nm, the layer is usable. When the layer has a thickness less than or equal to 1 nm, since there is a possibility that the peel strength is lowered or a non-adhered part is partially formed, it is desirable that the thickness be greater than or equal to 1 nm.

Examples of a device in the present invention include passive devices such as simple wiring for an electronic circuit, an electrical resistor, a coil and a capacitor, active devices including a semiconductor element and the like, and electronic circuit systems obtained by combining these. Examples of the semiconductor element include a solar cell, a thin film transistor, an MEMS element, a sensor and a logic circuit.

The solar cell including the polyimide film layered product of the present invention is prepared by forming a layered product including a photoelectric conversion layer made of a semiconductor on the polyimide film base material of the layered product. This layered product essentially includes a photoelectric conversion layer that converts the energy of solar light into electric energy, and usually, further includes an electrode layer for taking out the obtained electric energy, and the like.

Hereinafter, as a typical example of the above-mentioned layered product formed so as to constitute a film-shaped solar cell, a layered structure prepared by sandwiching a photoelectric conversion layer between a pair of electrode layers will be described. However, the constitution obtained by stacking several layers of the photoelectric conversion layer, and the like can also be referred to as the solar cell of the present invention, provided that the layers are prepared by PVD or CVD. The layered structure formed in the present invention is not limited to the embodiment described below, the constitution of a layered product of the solar cell in the prior art may be appropriately referred to, and a protective layer and known auxiliary means may be added thereto.

One electrode layer in the pair of electrode layers (hereinafter, also described as a back surface electrode layer) is preferably formed on one main surface of a polyimide film base material. The back surface electrode layer itself is obtained by stacking a conductive inorganic material by a method known per se, for example, a CVD (chemical vapor deposition) method or a sputtering method. Examples of the conductive inorganic material include metal thin films of Al, Au, Ag, Cu, Ni and stainless steel, oxide semiconductor-based conductive materials such as $In_2O_3$, $SnO_2$, ZnO, $Cd_2SnO_4$ and ITO (one prepared by adding Sn to $In_2O_3$), and the like. No particular limitation is put on the thickness of the back surface electrode layer, and the thickness is usually approximately 30 to 1000 nm. The back surface electrode layer is preferably a metal thin film. Moreover, one in which a part of the draw-out electrode is prepared by a film-forming method using an Ag paste or the like without utilizing vacuum can also be referred to as the solar cell of the present invention.

The photoelectric conversion layer that converts the energy of solar light into electric energy is a layer made of a semiconductor, and is a layer made of a $CuInSe_2$ (CIS) film which is a compound semiconductor thin film (chalcopyrite structure semiconductor thin film) made of a group I element, a group III element and a group VI element, or a $Cu(In, Ga)Se_2$ (CIGS) film which is prepared by dissolving Ga therein (hereinafter, the two are collectively referred to also as a CIS-based film), and a silicon-based semiconductor. Examples of the silicon-based semiconductor include a thin film silicon layer, an amorphous silicon layer, a polycrystalline silicon layer, and the like. The photoelectric conversion layer may be a layered product having a plurality of layers made of different semiconductors. Moreover, the layer may be a photoelectric conversion layer prepared with a coloring matter. Furthermore, the layer may be one prepared with an organic thin film semiconductor made from an organic compound such as a conductive polymer and a fullerene.

The thin film silicon layer is a silicon layer obtained by a plasma CVD method, a heat CVD method, a sputtering method, an ionized cluster beam technique, a vapor deposition method, or the like.

The amorphous silicon layer is a layer made of silicon having substantially no crystallinity. Having substantially no crystallinity can be confirmed by giving no diffraction peak even when the layer is irradiated with X-rays. Means for obtaining an amorphous silicon layer is known, and examples of such means include a plasma CVD method, a heat CVD method, and the like.

The polycrystalline silicon layer is a layer made of an aggregate of microcrystals of silicon. The polycrystalline silicon layer is distinguished from the above-mentioned amorphous silicon layer by giving a diffraction peak when irradiated with X-rays. Means for obtaining a polycrystalline silicon layer is known, and examples of such means include means for subjecting amorphous silicon to a heat treatment, and the like. The photoelectric conversion layer used in the present invention is not limited to a silicon-based semiconductor layer, and for example, the layer may be a thick film semiconductor layer. The thick film semiconductor layer is a semiconductor layer formed from a paste of titanium oxide, zinc oxide, copper iodide, and the like.

In the means for constituting a semiconductor material as the photoelectric conversion layer, a known method may be appropriately referred to. For example, an a-Si layer (n layer) of about 20 nm can be formed by performing high frequency plasma discharge in a gas prepared by adding phosphine ($PH_3$) to $SiH_4$ under a temperature of 200 to 500° C., subsequently, an a-Si layer (i layer) of about 500 nm can be formed in an $SiH_4$ gas only, and subsequently, by adding diborane ($B_2H_6$) to $SiH_4$, a p-Si layer (p layer) of about 10 nm can be formed.

Among a pair of electrode layers sandwiching a photoelectric conversion layer, an electrode layer disposed at the opposite side of a polyimide film base material (hereinafter, also referred to as a current collecting electrode layer) may be an electrode layer prepared by hardening a conductive paste containing a conductive filler and a binder resin, or may be a transparent electrode layer. As the transparent electrode layer, an oxide semiconductor-based material such as $In_2O_3$, $SnO_2$, ZnO, $Cd_2SnO_4$ and ITO (one prepared by adding Sn to $In_2O_3$), and the like can be preferably used.

Thus, a film-shaped solar cell, which is a preferred example of the embodiment of the present invention, prepared by stacking the transparent electrode/p-type a-Si/i-type a-Si/n-type a-Si/metal electrode/polyimide film in this order is obtained. Moreover, an a-Si layer as the p layer and a polycrystalline silicon layer as the n layer may be employed to attain a structure prepared by interposing a thin undoped a-Si layer between the two. In particular, when an a-Si/polycrystalline silicon-based hybrid type one is prepared, the sensitivity to a solar light spectrum is improved. In the preparation of a solar cell, in addition to the above-mentioned constitution, an antireflection layer, a surface protective layer, and the like may be added.

The thin film transistor (TFT) as an application example refers to one in which a semiconductor layer constituting a transistor, and an insulation film, an electrode, a protective insulation film, and the like constituting an element are prepared by depositing a thin film. The thin film transistor usually differs from one in which the silicon in a silicon wafer is used as a semiconductor layer. The thin film is usually prepared by a method utilizing vacuum such as PVD (physical vapor deposition) including vacuum deposition and CVD (chemical vapor deposition) including plasma CVD. As such, one which is not single crystal like a silicon wafer is included. Even when Si is used, a microcrystalline silicon TFT, a high temperature polysilicon TFT, a low temperature polysilicon TFT, an oxide semiconductor TFT, an organic semiconductor TFT, and the like are included.

Application examples of the MEMS element which represents an article prepared by taking advantage of the MEMS technique include an inkjet printer head, a probe for a scanning type probe microscope, a contactor for an LSI prober, a spatial light modulator for maskless exposure, an optical integrated element, an infrared ray sensor, a flow-rate sensor, an acceleration sensor, an MEMS gyro sensor, an RFMEMS switch, an intracorporeal/extracorporeal blood pressure sensor, and a video projector using a grating light valve, a digital micromirror device, or the like.

Application examples of the sensor include a strain gauge (an extensometer), a load cell, a semiconductor pressure sensor, a light sensor, a photoelectric element, a photodiode, a magnetic sensor, a contact type temperature sensor, a thermistor temperature sensor, a resistor bulb temperature sensor, a thermocouple temperature sensor, a noncontact temperature sensor, a radiation thermometer, a microphone, an ion concentration sensor, a gas concentration sensor, a displacement sensor, a potentiometer, a differential transformer displacement sensor, a rotation angle sensor, a linear encoder, a tacho generator, a rotary encoder, a position sensitive detector (PSD), an ultrasonic range finder, an electrostatic capacitance displacement meter, a laser Doppler vibration speedometer, a laser Doppler velocimeter, a gyro sensor, an acceleration sensor, an earthquake sensor, a one-dimensional image, a linear image sensor, a two-dimensional image, a CCD image sensor, a CMOS image sensor, a liquid/liquid leakage sensor (a leak sensor), a liquid detection sensor (a level sensor), a hardness sensor, an electric field sensor, a current sensor, a voltage sensor, an electric power sensor, an infrared ray sensor, a radiation sensor, a humidity sensor, an odor sensor, a flow-rate sensor, an inclination sensor, a vibration sensor, a time sensor, a composite sensor prepared by composing these sensors, a sensor in which, from a value detected by any of these sensors, another physical value or sensitivity index is output on the basis of some kind of calculation formula, and the like.

Application examples of the logic circuit include logic circuits based on NAND and OR, and one in which the synchronization is acquired by a clock.

In the present invention, although examples of a method for preparing a device on the easily releasable part of a layered product to obtain a polyimide layered product with the device and cutting out a polyimide film portion of the easily releasable part include a method of cutting out a polyimide film portion with an edged tool, a method of cutting out a polyimide film portion by allowing a laser beam and the layered product to be relatively scanned, a method of cutting out a polyimide film portion by allowing a water jet and the layered product to be relatively scanned, a method of cutting out a polyimide film portion while allowing an incision to be slightly made in the depthwise direction of a glass layer with a dicing device for the semiconductor chip, and the like, the apparatus is not particularly limited.

Moreover, in the case where a reinforcing member is attached before the polyimide film with a device is made into a final product, there is a possibility that a reinforcing member is fixed to the layered product previously attached with the device and then the polyimide film portion is cut out. As the method for attaching a reinforcing member, a method of adhering or sticking a separately prepared polymeric film, and the like are mentioned. In this case, the separately prepared polymeric film is reduced in heat resistance restriction more than the polyimide film since the polymeric film has already passed through the process requiring high temperatures, and various polymeric films can be selected.

Moreover, with regard to a cut-out position, in the case where the incision minutely follows the pattern on the polyimide surfaces of the satisfactorily bondable part and the easily releasable part, since there is a possibility that an error occurs, making an incision at the slightly more easily releasable part side than the pattern enhances the productivity. Moreover, there may be a production system in which the portion is prevented from spontaneously peel off until peeled off by an incision made at the slightly more hardly bondable part side than the pattern. Furthermore, eliminating the residue of the polyimide film remaining at the satisfactorily bondable part on peeling by setting the width of a hardly bondable part so as to be narrow enhances the utilization efficiency of the film, and constitutes one form of the present invention allowing the area of the device region to be increased relative to the area of the layered product to enhance the productivity. Furthermore, one extreme form of the present invention may also include a system of setting the outer peripheral part itself of the layered product to a cut-out position, irrespective of the number of devices, and peeling off without actually performing the cut-out process.

In the present invention, as a method for preparing a device on the easily releasable part of a layered product to obtain a polyimide layered product with the device, cutting out a polyimide film portion of the easily releasable part, and then, easily peeling off the portion from a substrate made from the inorganic substance, although there may be a method of turning up the portion from the end with tweezers or the like, there may also be a method of fixing one side portion of a cut-out part of the polyimide film with a device with a sticky tape, and then, turning up the cut-out part from the portion, and a method of sucking one side portion of a cut-out part of the polyimide film with a device by vacuum, and then, turning up the cut-out part from the portion. In these cases, when a cut-out part of the polyimide film with a device is bended in a state of having a small curvature, since there is a possibility that stress is applied to the device on the part and the device is broken, it is desirable that the cut-out part be peeled off in a state of having a curvature as large as possible. As such, it is desirable that the cut-out part be turned up using a machine having such a constitution that the cut-out part is turned up while wound around a roll with a large curvature or the peeled part is brought into contact with a roll with a large curvature.

Moreover, the cases where a reinforcing member is fixed to the layered product previously attached with a device and then the polyimide film portion is cut out, and a separately prepared reinforcing member is attached to a cut-out part of the polyimide film with a device and then the polyimide film portion is peeled off are desirable because the constitution in which stress is not applied to the device part as much as possible can be attained by taking the elastic modulus and the film thickness of the polyimide film and the polymeric film into consideration.

In the case where a separately prepared reinforcing member is attached to a cut-out part of the polyimide film with a device, as the reinforcing member, a polymeric film, extremely thin glass, SUS and the like can be mentioned. By the use of the polymeric film, there is an advantage that the lightweight properties of the device are maintained, and there are advantages that the film is satisfactory in transparency and various processabilities and that the film is hardly broken. By the use of the extremely thin glass, there is an advantage that the gas barrier properties, the stability against chemicals and the transparency are attained. By the use of the SUS, there are advantages that the device can be electrically shielded and that the SUS is hardly broken.

EXAMPLES

Hereinafter, the present invention will be described in more detail with reference to examples and comparative examples, but the present invention is not limited by the following examples. In this connection, the methods of evaluating physical properties in the following examples are as follows.

1. Reduced Viscosity of Polyamic Acid ($\eta sp/C$)

A solution prepared by dissolving a polymer in N-methyl-2-pyrrolidone (or N,N-dimethylacetamide) so that the polymer concentration became 0.2 g/dl was measured at 30° C. with an Ubbelohde type viscosity tube (in the case where the solvent used for the preparation of the polyamic acid solution was N,N-dimethylacetamide, a polymer was dissolved in N,N-dimethylacetamide and the reduced viscosity was measured).

2. Solution Viscosity of Polyamic Acid Solution

The solution viscosity was measured at 25° C. with a Brookfield viscometer.

3. Thickness of Polyimide Film or the Like

The thickness was measured using a micrometer (available from Feinpruf GmbH, Millitron 1245D).

4. Tensile Elastic Modulus, Tensile Breaking Strength and Tensile Breaking Elongation of Polyimide Film or Polyimide Layered Product One prepared by cutting a polyimide film or a polyimide layered product as a measuring object into a strip shape with a size of 100 mm in the flow direction (MD direction)×10 mm in the widthwise direction (TD direction) was employed as a test specimen. Using a tensile testing machine (available from Shimadzu Corp., Autograph (R) model name AG-5000A), under the conditions of a tensile speed of 50 mm/minute and a distance between chucks of 40 mm, with regard to each of the MD direction and the TD direction, the tensile elastic modulus, the tensile breaking strength and the tensile breaking elongation were measured.

5. 180-Degree Peel Strength

The 180-degree peeling test was performed under the following conditions according to a 180-degree peeling method of JIS C 6471 to determine the peel strength of a polyimide film against a support and the peel strength of a varnish layer against a polyimide film. Moreover, for this measurement, separately, a sample which is not subjected to UV irradiation was prepared, and the measurement for peel strength was performed. This sample was constituted so that the polyimide film had a size of 110 mm×200 mm while the glass had a size of 100 mm square, and on one side thereof, an unbondable part in the polyimide film was prepared so that this part constituted "a grasping margin".

Name of apparatus; Autograph AG-IS available from Shimadzu Corp.

Measurement temperature; Room temperature
Peeling speed; 50 mm/min
Atmosphere; Air
Width of measurement sample; 1 cm Next, on the coupling-treated layer surface of the support provided with the coupling-treated layer obtained above, a polyimide film prepared by cutting out a portion with a pattern of 70 mm×70 mm (70 mm square) was disposed as a mask, and the area within a range of 70 mm×70 mm (70 mm square) was subjected to a UV irradiation treatment with a peripheral margin of the layered product of 15 mm being left for each side. In this connection, the UV irradiation was performed for 4 minutes, using a UV/$O_3$ washing and reforming apparatus ("SKB1102N-01") and a UV lamp ("SE-1103G05") both available from LANTECHNICAL SERVICE CO., LTD., from the UV lamp at a distance of approximately 3 cm. At the time of irradiation, no specified gas was charged into the UV/$O_3$ washing and reforming apparatus, and the UV irradiation was performed at room temperature under an air atmosphere. In this connection, the UV lamp gives off a bright line with a wavelength of 185 nm (a short wavelength allowing ozone which promotes a deactivation treatment) and a bright line with a wavelength of 254 nm. In this case, the illuminance was determined to be approximately 20 mW/$cm^2$ (measured at a wavelength of 254 nm with an illuminance meter ("ORC UV-M03AUV")).

Moreover, a polyimide film prepared by cutting out a portion with a size of 70 mm square was used as a mask. Then, this sample was also constituted so that the polyimide film had a size of 110 mm×2000 mm while the glass had a size of 100 mm square, and on one side thereof, an unbondable part in the polyimide film was prepared so that this part constituted "a grasping margin".

In this connection, with regard to the peel strength after the layered product is heated at 400° C. for 1 hour, a layered product prepared under the same condition was placed in a muffle furnace through which $N_2$ was passed and allowed to have a nitrogen atmosphere, and the layered product was heated at a heating rate of 10° C./minute to 400° C. and held in place at 400° C. for 1 hour. Subsequently, the door of the muffle furnace was opened and the layered product was allowed to spontaneously cool under an air atmosphere. A heat treatment was performed. With regard to this polyimide layered product with a support after cooling, the peel strength was determined in the same manner as above under the conditions of room temperature and atmospheric pressure.

Similarly, in a PCT chamber, a layered product which had been allowed to stand under an environment of a saturated water vapor pressure, 2 atm and 121° C. for 96 hours was taken out therefrom into the air, after which the peel strength was determined in the same manner as above under the conditions of room temperature and atmospheric pressure.

With regard to the peel strength of a varnish layer, using an epoxy resin as an adhesive layer for the polyimide layered product with the support, the evaluation was performed by sticking a polyimide film of NO. 1 shown in the following Table 3 on the upper surface of the varnish layer.

6. Coefficient of Linear Thermal Expansion (CTE)

A polyimide film or a polyimide layered product as a measuring object was measured for the expansion/contraction rate in the flow direction (MD direction) and the widthwise direction (TD direction) under the following conditions. Values of the expansion/contraction rate/temperature in the ranges at 15° C. intervals of 30° C. to 45° C., 45° C. to 60° C., . . . were measured, and this measurement was continued until the temperature reached 300° C. and an average value of all the measured values was calculated as the CTE.

Name of instrument; TMA4000S available from MAC Science Ltd.
    Sample length; 20 mm
    Sample width; 2 mm
    Temperature rising onset temperature; 25° C.
    Temperature rising end temperature; 400° C.
    Rate of temperature rise; 5° C./min
    Atmosphere; Argon
    Initial load; 34.5 g/mm$^2$ 7. Ra Value Measurement For the measurement of the surface shape, a scanning probe microscope with surface physical properties evaluating function (SPA300/nanonavi available from SII Nano Technology Inc.) was used. The measurement was performed using the DFM mode, and as a cantilever, DF3 or DF20 available from SII Nano Technology Inc. was used. As a scanner, FS-20A was used, the scanning range was set to 10 μm square and the measurement resolution was set to 512 pixels×512 pixels. With regard to the measured image, the secondary inclination correction is performed, after which other planarization treatments are appropriately performed in the case where, after observation, noise associated with the measurement is included, and for example, a flattening treatment is performed. Following this, the Ra value and the PV value are calculated with software attached to the apparatus, the same operation is performed at 3 different extracted (photographing) areas, and each of average values of the calculated Ra values and the calculated PV values was employed.

8. Average Particle Diameter of Inorganic Particles

Inorganic particles as a measuring object were dispersed in a solvent as described below, the particle diameter distribution was determined on a laser scattering type particle size analyzer LB-500 available from HORIBA, Ltd., and the weight (volume) average particle diameter and the CV value were calculated.

9. Warpage, Exfoliation and Turbidity

The obtained polyimide layered product with the support was visually observed.

○: There is no warpage, nor exfoliation, nor white turbidity in the polyimide layered product with the support.

Δ: There are warpage, exfoliation and white turbidity in a part of the polyimide layered product with the support.

×: There are warpage, exfoliation and white turbidity in the polyimide layered product with the support.

10. Measuring Method of Coupling Agent Layer Thickness

As the coupling agent layer thickness, the thickness of a film formed on an Si wafer was measured.

With regard to the measuring method for film thickness, the measurement was performed by ellipsometry, and as a measuring instrument, FE-5000 available from Photal was used.

The hard specifications of this measuring instrument are as follows.

Reflection angle range 45 to 80°, wavelength range 250 to 800 nm, wavelength resolution 1.25 nm, spot diameter 1 mm, tan Ψ measurement accuracy±0.01, cos Δ measurement accuracy±0.01, mode rotating analyzer method. The measurement was performed under the conditions of polarizer angle 45°, incidence 70° fixed, analyzer of 0 to 360° in 11.25° increments, and 250 to 800 nm.

The film thickness was determined by fitting using a nonlinear least-squares method. In this case, as the model, with a model of Air/Thin film/Si, C1 to C6 were determined as the wavelength-dependence by the equations of $$n = C3/\lambda 4 + C2/\lambda 2 + C1 \text{ and}$$

$$k = C6/\lambda 4 + C5/\lambda 2 + C4.$$

11. Cross-Section Observation

A polyimide layered product small specimen cut out into a size of 2 mm×10 mm was embedded in an acrylic resin (ARONIX available from TOAGOSEI CO., LTD.), after which the preparation for the cross-section sample of the polyimide layered product small specimen was performed in the usual way using a microtome. The whole area of 2 mm in width of the prepared cross-section sample was observed with a differential interference microscope (OPTIPHOT available from NIKON CORPORATION, objective lens at 40 magnifications) to be appropriately photographed after it was confirmed that the area is not an unusual part.

In this connection, the respective numbers of pixels at the time of photographing are 1280 horizontal pixels×1024 vertical pixels in a visual field with a horizontal length×a vertical length of 282 μm×353 μm.

Moreover, as polyimide layered products for photographing, samples as Examples 19, 20 and 21 differing in thickness from Example 1, Example 9 and Example 10, respectively were prepared.

Production Examples 1 to 3

(Preparation of Polyamic Acid Solution A)

After the inside of a reaction vessel equipped with a nitrogen inlet tube, a thermometer and a stirring rod was replaced with nitrogen, 223 parts by mass of 5-amino-2-(p-aminophenyl)benzoxazole and 4416 parts by mass of N,N-dimethylacetamide were added thereto and completely dissolved. Then, 217 parts by mass of pyromellitic acid dianhydride and SNOWTEX prepared by dispersing colloidal silica as a slip agent in dimethylacetamide (DMAC-ST30, available from Nissan Chemical Industries, Ltd.) in an amount that the silica content becomes the content described in Table 1 were added thereto. The liquid was stirred for 24 hours at a reaction temperature of 25° C., whereupon each of brown viscous polyamic acid solutions A1 to A3 was obtained. The measurement results are described in Table 1 and Table 2.

Production Examples 4 to 6

(Preparation of Polyamic Acid Solution B)

After the inside of a reaction vessel equipped with a nitrogen inlet tube, a thermometer and a stirring rod was replaced with nitrogen, 398 parts by mass of 3,3',4,4'- biphenyltetracarboxylic acid dianhydride as a tetracarboxylic acid dianhydride and 147 parts by mass of paraphenylenediamine were dissolved in 4600 parts by mass of N,N-dimethylacetamide. The solution was subjected to a reaction in the same manner while the temperature was maintained at a temperature less than or equal to 20° C. to obtain each of polyamic acid solutions B1 to B3. The measurement results are described in Table 1 and Table 2.

Production Examples 7 to 9

(Preparation of Polyamic Acid Solution C)

After the inside of a reaction vessel equipped with a nitrogen inlet tube, a thermometer and a stirring rod was replaced with nitrogen, 545 parts by mass of pyromellitic acid dianhydride and 500 parts by mass of 4,4'-diaminodiphenyl ether were dissolved in 8000 parts by mass of N,N-dimethylacetamide. The solution was stirred for 24 hours at a reaction temperature of 25° C., whereupon each of brown viscous polyamic acid solutions C1 to C3 was obtained. The measurement results are described in Table 1 and Table 2.

Production Examples 10 to 12

(Preparation of Polyamic Acid Solution D)

Into a reaction apparatus equipped with a stirrer, a water separator, a thermometer and a nitrogen gas inlet tube, 1400 g of glycidol (available from NOF CORPORATION, trade name "EPIOL OH") and 4478.9 g of a partial condensate of tetramethoxysilane (available from TAMA CHEMICALS CO., LTD., trade name "Methyl silicate 51", the average number of Si atoms is 4) were placed, and to this, under a stream of nitrogen, 1.1 g of dibutyltin dilaurate was added. The contents were allowed to undergo a reaction. During the reaction, the methanol produced was distilled off using the water separator, and at the point of time at which the amount thereof reached about 580 g, the reaction apparatus was cooled. The time required after initiation of the temperature rise before completion of the cooling was 6 hours. Then, about 30 g of methanol remaining in the system was removed under reduced pressure of 13 kPa for about 10 minutes. In this way, a partial condensate (1) of alkoxysilane containing epoxy groups was obtained.

In this connection, the equation of the hydroxyl equivalent of the epoxy compound at the time of being placed/the alkoxy group of the partial condensate of alkoxysilane (equivalent ratio)=0.20 holds, and the epoxy equivalent is determined to be 279 g/eq.

In a 2-L three-necked flask equipped with a stirrer, a condenser tube, a thermometer and a nitrogen gas inlet tube, 85.1 g of ODA as a diamine (B) and 1131.5 g of NMP were placed, and the contents were well mixed at room temperature until the ODA was completely dissolved, after which 86.7 g of PMDA as a tetracarboxylic acid dianhydride (A) was added thereto and stirred for 30 minutes while the contents were cooled to 60° C. or lower to synthesize a polyamic acid (1-1). The equation of (the number of moles of the tetracarboxylic acid dianhydride (A)/the number of moles of diamines (B))=0.94 holds, and the solid residue in terms of polyimide was determined to be 12.7%.

Next, the temperature was elevated to 80° C., and 63.9 g of the partial condensate (1) of alkoxysilane containing epoxy groups was added and stirred for 10 hours at 80° C. to obtain a polyamic acid (1-2).

The equation of (the epoxy equivalent of the partial condensate of alkoxysilane containing epoxy groups/the number of moles of the tetracarboxylic acid dianhydride (A) used for the polyamic acid (1-1))=0.58 holds.

Furthermore, the polyamic acid (1-2) was cooled to 40° C., and 46.0 g of p-PDA as a diamine (D) and 485.5 g of NMP were added and the contents were well mixed until the p-PDA was completely dissolved. Then, 131.8 g of BPDA as a tetracarboxylic acid dianhydride (C) was added with cooling and allowed to undergo a chain extension reaction at 50° C. for 1 hour to obtain each of polyamic acids D1 to D3. The measurement results are described in Table 1 and Table 2.

Production Example 13

(Preparation of Polyamic Acid Solution E)

After the inside of a reaction vessel equipped with a nitrogen inlet tube, a thermometer and a stirring rod was replaced with nitrogen, 930 parts by mass of 1,3-bis(4-aminophenoxy)benzene was placed therein and 15000 parts by mass of N,N-dimethylacetamide was introduced thereinto. The liquid was well stirred so as to become homogeneous, after which this solution was cooled to 0° C. To the solution, 990 parts by mass of 4,4'-oxydiphthalic acid anhydride was added and stirred for 17 hours. A pale yellow viscous polyamic acid solution E was obtained. The measurement results are described in Table 1 and Table 2.

Production Example 14

(Preparation of Polyamic Acid Solution F)

In a 300-ml four-necked flask as a reaction apparatus provided with a thermometer, a stirring apparatus, a reflux condenser and a dry $N_2$ inlet, 146 g of N,N-dimethylacetamide was placed, and under a stream of nitrogen, 14.0 g (90 mol %) of bis(3-aminopropyl)tetramethyldisiloxane and 0.68 g (10 mol %) of p-phenylenediamine were dissolved therein.

Then, to the solution, 20.3 g (100 mol %) of 3,3',4,4'-benzophenonetetracarboxylic acid dianhydride was added and stirring was continued for 1 hour at 10° C. Then, the liquid was stirred for 3 hours at 50° C. and subjected to a reaction to obtain a polyamic acid solution F. The measurement results are described in Table 1 and Table 2.

Production Example 15

(Preparation of Polyamic Acid Solution G)

After the inside of a reaction vessel equipped with a nitrogen inlet tube, a thermometer and a stirring rod was replaced with nitrogen, 223 parts by mass of 5-amino-2-(p-aminophenyl)benzoxazole, 40 parts by mass of 4,4'-diaminodiphenyl ether and 8000 parts by mass of N,N-dimethylacetamide were added thereto and completely dissolved. Then, 217 parts by mass of pyromellitic acid dianhydride and 40 parts by mass of 3,3',4,4'-biphenyltetracarboxylic acid dianhydride were added thereto. The liquid was stirred for 24 hours at a reaction temperature of 25° C., whereupon a brown viscous polyamic acid solution G was obtained. The measurement results are described in Table 1 and Table 2.

TABLE 1

| | Unit | Production Example 1 | Production Example 2 | Production Example 3 | Production Example 4 | Production Example 5 | Production Example 6 |
|---|---|---|---|---|---|---|---|
| Polyamic acid solution | | A1 | A2 | A3 | B1 | B2 | B3 |
| Kind of slip agent | | Silica | — | — | Silica | — | — |
| Particle size of slip agent | μm | 0.08 | — | — | 0.08 | — | — |
| Amount of slip agent added | % by mass | 0.5 | 0 | 0 | 0.5 | 0 | 0 |

| | Unit | Production Example 7 | Production Example 8 | Production Example 9 | Production Example 10 | Production Example 11 | Production Example 12 |
|---|---|---|---|---|---|---|---|
| Polyamic acid solution | | C1 | C2 | C3 | D1 | D2 | D3 |
| Kind of slip agent | | Silica | — | — | Silica | — | — |
| Particle size of slip agent | μm | 0.08 | — | — | 0.08 | — | — |
| Amount of slip agent added | % by mass | 0.5 | 0 | 0 | 0.5 | 0 | 0 |

| | Unit | Production Example 13 | Production Example 14 | Production Example 15 |
|---|---|---|---|---|
| Polyamic acid solution | | E | F | G |
| Kind of slip agent | | — | — | — |
| Particle size of slip agent | μm | — | — | — |
| Amount of slip agent added | % by mass | 0 | 0 | 0 |

TABLE 2

| | Unit | Production Example 1 | Production Example 2 | Production Example 3 | Production Example 4 | Production Example 5 | Production Example 6 |
|---|---|---|---|---|---|---|---|
| Polyamic acid solution | | A1 | A2 | A3 | B1 | B2 | B3 |
| Resin concentration | % | 10 | 10 | 20 | 10 | 10 | 20 |
| Reduced viscosity | dl/g | 2.5 | 2.8 | 0.59 | 2.3 | 2.7 | 0.72 |
| Solution viscosity | Pa·s | 78 | 70 | 4.1 | 65 | 75 | 6.9 |

| | Unit | Production Example 7 | Production Example 8 | Production Example 9 | Production Example 10 | Production Example 11 | Production Example 12 |
|---|---|---|---|---|---|---|---|
| Polyamic acid solution | | C1 | C2 | C3 | D1 | D2 | D3 |
| Resin concentration | % | 10 | 10 | 20 | 10 | 10 | 20 |
| Reduced viscosity | dl/g | 2.8 | 2.7 | 0.65 | 2.2 | 2.3 | 0.68 |
| Solution viscosity | Pa·s | 74 | 86 | 4.3 | 83 | 82 | 4.4 |

| | Unit | Production Example 13 | Production Example 14 | Production Example 15 |
|---|---|---|---|---|
| Polyamic acid solution | | E | F | G |
| Resin concentration | % | 10 | 10 | 10 |
| Reduced viscosity | dl/g | 0.67 | 0.69 | 0.65 |
| Solution viscosity | Pa·s | 5.2 | 4.8 | 4.3 |

Film Preparation Example 1

A polyamic acid solution A1 was applied to a slip agent material-free surface of a polyethylene terephthalate film A-4100 (available from TOYOBO CO., LTD.) so that the final film thickness (the film thickness of the polyimide film finally obtained) became the "thickness (b layer)" shown in Table 3 using a comma coater, and dried for 5 minutes at 110° C., after which a single-layered polyamic acid film was wound together with the PET film (without peeling off the single-layered film from the PET film). The single-layered polyamic acid film wound together with the PET film as a film-forming support was attached to an unwinding part of a film-forming machine. A polyamic acid solution A2 was applied to a single-layered polyamic acid film surface using a comma coater so as to attain the thickness after drying shown as the "thickness (a layer)" in Table 3, and dried for 20 minutes at 110° C. to obtain a multi-layered polyamic acid film including two layers on the PET film as a film-forming support.

Next, the obtained multi-layered polyamic acid film including two layers was peeled off from the PET film as a film-forming support, was passed through a pin tenter having three heat treatment zones, was subjected to heat treatments of the first 150° C.×2 minutes stage, the second 220° C.×2 minutes stage and the third 475° C.×4 minutes stage, and was slit so as to have a width of 500 mm to obtain a polyimide film 1 with a multilayer structure. In this connection, after the heat treatment, as a releasable non-polyimide protective film, a PET film (protective film A) provided with a slightly adhesive layer on one surface thereof was laminated at the b layer side (the polyamic acid solution A1 side in the present example) to be wound. The characteristics of the obtained polyimide film 1 are shown in Table 3. In this connection, the protective film A is one that was stuck thereon for the purposes of preventing a foreign substance from adhering to the film surface, preventing a scratch from being formed on the film surface, and the like. At the time of being transported by a roll-to-roll process at a relatively low temperature, and at the time of being handled by hand, these operations were performed in a state of allowing the protective film A to be stuck thereon. However, at the time of performing pressing, laminating and the like under the condition of a temperature exceeding 130° C., or at the time of subjecting the surface on which the protective film A had been stuck to respective treatments, respective operations were performed after the protective film A was peeled off therefrom.

Film Preparation Example 2

A polyimide film 2 was obtained in the same manner as that in Film Preparation Example 1 except that the amounts of the polyamic acid solutions A1 and A2 applied were changed so as to attain the respective thicknesses after drying shown in Table 3. The characteristics of the obtained polyimide film are shown in Table 3.

Film Preparation Example 3

A polyimide film 3 was obtained in the same manner as that in Film Preparation Example 1 except that the polyamic acid solution A1 was changed to B1, the polyamic acid solution A2 was changed to B2, and the amounts of the polyamic acid solutions B1 and B2 applied were changed so as to attain the respective thicknesses after drying shown in Table 3. The characteristics of the obtained polyimide film are shown in Table 3.

Film Preparation Example 4

A polyimide film 4 was obtained in the same manner as that in Film Preparation Example 1 except that the polyamic acid solution A1 was changed to C1, the polyamic acid solution A2 was changed to C2, and the amounts of the polyamic acid solutions C1 and C2 applied were changed so as to attain the respective thicknesses after drying shown in Table 3. The characteristics of the obtained polyimide film are shown in Table 3.

Film Preparation Example 5

A polyimide film 5 was obtained in the same manner as that in Film Preparation Example 1 except that the polyamic acid solution A1 was changed to D1, the polyamic acid solution A2 was changed to D2, and the amounts of the polyamic acid solutions D1 and D2 applied were changed so as to attain the respective thicknesses after drying shown in Table 3. The characteristics of the obtained polyimide film are shown in

TABLE 3

| Film No. | | | 1 | 2 | 3 | 4 | 5 |
|---|---|---|---|---|---|---|---|
| Polyamic acid solution (for a layer) | | | A2 | A2 | B2 | C2 | D2 |
| Polyamic acid solution (for b layer) | | | A1 | A1 | B1 | C1 | D1 |
| Thickness (a layer) | | | 5 | 33 | 5 | 5 | 5 |
| Thickness (b layer) | | | 33 | 5 | 33 | 33 | 33 |
| Thickness of polyimide film | | μm | 38 | 38 | 28 | 38 | 38 |
| Tensile breaking strength | MD | MPa | 530 | 510 | 504 | 341 | 200 |
| | TD | | 521 | 526 | 506 | 329 | 230 |
| Tensile elastic modulus | MD | GPa | 8.5 | 8.3 | 9 | 3.6 | 5.4 |
| | TD | | 8.4 | 8.2 | 9.6 | 3.3 | 5.4 |
| Elongation | MD | % | 40 | 35 | 37 | 78 | 50 |
| | TD | | 42 | 38 | 47 | 89 | 50 |
| Coefficient of linear thermal expansion (CTE) | MD | ppm/° C. | 3.5 | 3.4 | 10 | 17 | 3 |
| | TD | | 2.6 | 2.9 | 12 | 15 | 3.5 |

Film Treatment Examples 1 to 5

Using each of films 1 to 5, the slip agent material-free polyimide side (a layer side) of this polyimide film was subjected to a vacuum plasma treatment. The vacuum plasma treatment is a treatment by RIE mode RF plasma using parallel flat plate type electrodes. The treatment was performed by introducing $O_2$ gas into a vacuum chamber and introducing radiofrequency power of 13.56 MHz thereinto for a treatment time of 3 minutes.

After the inside of a glove box was replaced with nitrogen, a silane coupling agent (3-aminopropyl trimethoxysilane) was diluted to 1 wt % with isopropyl alcohol in the glove box allowing $N_2$ to flow. Then, to a spin coater in a state of allowing the inside of the spin coater to be filled with the vapor of isopropyl alcohol (at least the inside of the spin coater has an isopropyl alcohol concentration higher than or equal to 1000 ppm), a sheet of glass as a support (Corning EAGLE XG 100 mm×100 mm×0.7 mm in thickness) prepared by being subjected to ultrasonic cleaning with pure water for 5 min, ultrasonic cleaning with ethanol for 5 min and ultrasonic cleaning with pure water for 5 min was installed. By dropping some isopropyl alcohol thereon, shaking off the liquid at 1000 rpm, performing drying, and subsequently, dropping a diluted liquid of the coupling agent at the rotated center part, the silane coupling agent was dropped at the rotated center part. The sheet of glass was rotated at 500 rpm, the rotation number was raised to 2500 rpm over a 15-second period, the film was rotated at 2500 rpm for 15 seconds, and then the rotation was stopped over a 15-second period to allow the whole surface to be in a state of being wet and then in a state of being dry. This was heated for 1 minute on a hot plate which has been heated to 110° C. and placed in a clean bench to obtain a coupling agent-treated support provided with a coupling-treated layer of 11 nm in thickness.

Next, on the coupling-treated layer surface of the support provided with a coupling-treated layer obtained above, a polyimide film prepared by cutting out a portion with a pattern of 70 mm×70 mm (70 mm square) was disposed as a mask, and the area within a range of 70 mm×70 mm (70 mm square) was subjected to a UV irradiation treatment with a peripheral margin of the layered product of 15 mm being left for each side. In this connection, the UV irradiation was performed for 4 minutes, using a UV/$O_3$ washing and reforming apparatus ("SKB1102N-01") and a UV lamp ("SE-1103G05") both available from LANTECHNICAL SERVICE CO., LTD., from the UV lamp at a distance of approximately 3 cm. At the time of irradiation, no specified gas was charged into the UV/O$_3$ washing and reforming apparatus, and the UV irradiation was performed at room temperature under an air atmosphere. In this connection, the UV lamp gives off a bright line with a wavelength of 185 nm (a short wavelength allowing ozone which promotes a deactivation treatment) and a bright line with a wavelength of 254 nm. In this case, the illuminance was determined to be approximately 20 mW/cm$^2$ (measured at a wavelength of 254 nm with an illuminance meter ("ORC UV-M03AUV")).

Next, the coupling agent treatment·UV irradiation treatment surface of the support after the UV irradiation treatment and each treatment surface of the treated polyimide films obtained in Film Treatment Examples 1 to 5 were superposed so as to face each other, and pressed under vacuum for 10 minutes at a pressure of 10 MPa at 300° C. by allowing the degree of vacuum to be 10+2 Pa or less with a rotary pump to be subjected to a pressurizing/heating treatment, and a polyimide layered product with a support was obtained.

The evaluation results of the obtained polyimide layered product with the support are shown in Table 4. The layered product was observed with an optical microscope, whereupon there was no loss of shoulders nor pattern residue, and a satisfactory pattern was obtained. This is referred to as a pattern film.

placed in a muffle furnace, the inside of which was replaced with N$_2$, and dried at 100° C. for 20 minutes, after which the temperature was elevated to 350° C. over an 80-minute period and then held at 350° C. for 1 hour. In this case, in order to prevent the adhesion of a foreign substance and the like to the polyimide layered product, by wrapping the polyimide layered product with aluminum foil, the polyimide layered product was prevented from directly contacting with the outside air. After the drop of the internal temperature of the muffle furnace to 50° C. or lower was confirmed, the polyimide layered product was taken out of the muffle furnace to prepare a polyimide layered product with a support provided with a varnish layer of 5 μm in thickness. The evaluation results and the like are shown in Table 5 and Table 6.

Example 2

The preparation of a polyimide layered product with a support was performed in the same manner as that in Example 1 except that a pattern film 2 was employed as the pattern film used. The evaluation results and the like are shown in Table 5 and Table 6.

TABLE 4

|  | Unit | Film Treatment Example 1 | Film Treatment Example 2 | Film Treatment Example 3 | Film Treatment Example 4 | Film Treatment Example 5 |
|---|---|---|---|---|---|---|
|  |  | \multicolumn{5}{c}{Film No.} |  |  |  |  |
|  |  | 1 | 2 | 3 | 4 | 5 |
| Peel strength of UV unirradiated part | N/cm | 2 | 2.4 | 2.5 | 2.1 | 2.3 |
| Peel strength of UV irradiated part | N/cm | 0.2 | 0.2 | 0.1 | 0.2 | 0.3 |
| Peel strength of UV unirradiated part after heating at 400° C. for 1 hour | N/cm | 1.8 | 2.2 | 2.3 | 2 | 2.2 |
| Peel strength of UV irradiated part after heating at 400° C. for 1 hour | N/cm | 0.2 | 0.2 | 0.1 | 0.2 | 0.1 |
| Peel strength of UV unirradiated part after PCT test | N/cm | 1.9 | 2.1 | 2.4 | 1.8 | 1.9 |
| Peel strength of UV irradiated part after PCT test | N/cm | 0.2 | 0.2 | 0.1 | 0.2 | 0.2 |

Example 1

At room temperature, 200 cc of a mixed solution of tetramethylammonium hydroxide (TMAH) (2.5 wt %), water (7.5 wt %) and dimethyl sulfoxide (DMSO) (90 wt %) was prepared and placed in a tray. In this, a pattern film 1 was immersed for 3 minutes and then taken out thereof. After liquid draining was performed, the film was immersed in 2-propanol (IPA) contained in a tray for 1 minute, immersed in pure water contained in a tray for 1 minute, and then dried in a clean bench. The pattern film 1 which has been subjected to an organic alkali treatment was installed inside a spin coater. A polyimide A3 was dropped at the rotated center part with the coating thickness being adjusted so that the thickness after baking became 5 μm. The film was rotated at 500 rpm, the rotation number was raised to 2500 rpm over a 15-second period, the film was rotated at 2500 rpm for 15 seconds, and then the rotation was stopped over a 15-second period to obtain a polyimide layered product with a support. Subsequently, the layered product was Example 3

The preparation of a polyimide layered product with a support was performed in the same manner as that in Example 1 except that B3 was employed for the varnish layer. The evaluation results and the like are shown in Table 5 and Table 6.

Example 4

The preparation of a polyimide layered product with a support was performed in the same manner as that in Example 1 except that C3 was employed for the varnish layer. The evaluation results and the like are shown in Table 5 and Table 6.

Example 5

The preparation of a polyimide layered product with a support was performed in the same manner as that in Example 1 except that D3 was employed for the varnish layer. The evaluation results and the like are shown in Table 5 and Table 6.

Example 6

The preparation of a polyimide layered product with a support was performed in the same manner as that in Example 1 except that E was employed for the varnish layer. The evaluation results and the like are shown in Table 5 and Table 6.

Example 7

The preparation of a polyimide layered product with a support was performed in the same manner as that in Example 1 except that F was employed for the varnish layer. The evaluation results and the like are shown in Table 5 and Table 6.

Example 8

The preparation of a polyimide layered product with a support was performed in the same manner as that in Example 1 except that G was employed for the varnish layer. The evaluation results and the like are shown in Table 5 and Table 6.

Example 9

The preparation of a polyimide layered product with a support was performed in the same manner as that in Example 1 except that a pattern film 3 was employed as the pattern film used. The evaluation results and the like are shown in Table 5, Table 6 and FIG. 1.

Example 10

The preparation of a polyimide layered product with a support was performed in the same manner as that in Example 1 except that a pattern film 4 was employed as the pattern film used. The evaluation results and the like are shown in Table 5, Table 6 and FIG. 1.

Example 11

The preparation of a polyimide layered product with a support was performed in the same manner as that in Example 1 except that a pattern film 5 was employed as the pattern film used. The evaluation results and the like are shown in Table 5 and Table 6.

Example 12

The preparation of a polyimide layered product with a support was performed in the same manner as that in Example 9 except that B3 was employed for the varnish layer. The evaluation results and the like are shown in Table 5 and Table 6.

Example 13

The preparation of a polyimide layered product with a support was performed in the same manner as that in Example 11 except that C3 was employed for the varnish layer. The evaluation results and the like are shown in Table 5 and Table 6.

Example 14

The preparation of a polyimide layered product with a support was performed in the same manner as that in Example 9 except that D3 was employed for the varnish layer. The evaluation results and the like are shown in Table 5 and Table 6.

Example 15

The preparation of a polyimide layered product with a support was performed in the same manner as that in Example 10 except that E was employed for the varnish layer. The evaluation results and the like are shown in Table 5 and Table 6.

Example 16

The preparation of a polyimide layered product with a support was performed in the same manner as that in Example 9 except that F was employed for the varnish layer. The evaluation results and the like are shown in Table 5 and Table 6.

TABLE 5

|  | Unit | Example 1 | Example 2 | Example 3 | Example 4 | Example 5 | Example 6 |
|---|---|---|---|---|---|---|---|
| Pattern film used |  | 1 | 1 | 2 | 1 | 1 | 1 |
| Varnish used |  | A3 | A3 | B3 | C3 | D3 | E |
| Polyimide layered product CTE | ppm/° C. | 2.3 | 2.36 | 5.2 | 8 | 7.5 | 8.3 |
| Ra | nm | 0.3 | 0.35 | 0.45 | 0.42 | 0.43 | 0.45 |
| Warpage, exfoliation and turbidity of film and varnish |  | ○ | ○ | ○ | ○ | ○ | ○ |
| Peel strength of varnish from film | N/cm | 8.3 | 8.1 | 8.5 | 7.9 | 8.2 | 8.5 |
| Peel strength of varnish from film after heating at 400° C. for 1 hour | N/cm | 8.3 | 8.2 | 8.3 | 8.6 | 8.4 | 8.2 |
| Peel strength of varnish from film after PCT test | N/cm | 8.1 | 8.4 | 8.1 | 8.4 | 8.3 | 8.3 |

|  | Unit | Example 7 | Example 8 | Example 9 | Example 10 | Example 11 |
|---|---|---|---|---|---|---|
| Pattern film used |  | 1 | 1 | 3 | 4 | 5 |
| Varnish used |  | F | G | A3 | A3 | A3 |
| Polyimide layered product CTE | ppm/° C. | 9.2 | 8.4 | 4.2 | 6.5 | 5.3 |

TABLE 5-continued

|  | | Example 7 | Example 8 | Example 9 | Example 10 | Example 11 |
|---|---|---|---|---|---|---|
| Ra | nm | 0.55 | 0.34 | 0.5 | 0.55 | 0.53 |
| Warpage, exfoliation and turbidity of film and varnish | | ○ | ○ | ○ | ○ | ○ |
| Peel strength of varnish from film | N/cm | 8.5 | 8.3 | 8.4 | 8.7 | 8.6 |
| Peel strength of varnish from film after heating at 400° C. for 1 hour | N/cm | 8.6 | 8.2 | 8.5 | 8.3 | 8.4 |
| Peel strength of varnish from film after PCT test | N/cm | 8.4 | 8.1 | 8.2 | 8.4 | 8.6 |

|  | Unit | Example 12 | Example 13 | Example 14 | Example 15 | Example 16 |
|---|---|---|---|---|---|---|
| Pattern film used | | 2 | 3 | 3 | 4 | 3 |
| Varnish used | | B3 | C3 | D3 | E | F |
| Polyimide layered product CTE | ppm/° C. | 5.1 | 7.5 | 3.4 | 6.5 | 4.5 |
| Ra | nm | 0.48 | 0.59 | 0.45 | 0.54 | 0.55 |
| Warpage, exfoliation and turbidity of film and varnish | | ○ | ○ | ○ | ○ | ○ |
| Peel strength of varnish from film | N/cm | 8.2 | 8.7 | 8.4 | 8.7 | 8.6 |
| Peel strength of varnish from film after heating at 400° C. for 1 hour | N/cm | 8.1 | 8.6 | 8.6 | 8.6 | 8.2 |
| Peel strength of varnish from film after PCT test | N/cm | 8.1 | 8.8 | 8.3 | 8.4 | 8.3 |

TABLE 6

|  | Unit | Example 1 | Example 2 | Example 3 | Example 4 | Example 5 | Example 6 |
|---|---|---|---|---|---|---|---|
| Pattern film used | | 1 | 1 | 1 | 1 | 1 | 1 |
| Varnish used | | A3 | A3 | B3 | C3 | D3 | E |
| Tensile breaking strength of polyimide layered product with support (heated at 400° C. for 1 hour) | MPa | 472 | 465 | 490 | 346 | 356 | 320 |
| Tensile elastic modulus of polyimide layered product with support (heated at 400° C. for 1 hour) | GPa | 8.3 | 8.1 | 8.2 | 5.6 | 4.5 | 5.5 |
| Elongation of polyimide layered product with support (heated at 400° C. for 1 hour) | % | 35 | 36 | 43 | 54 | 50 | 42 |
| CTE of polyimide layered product with support (heated at 400° C. for 1 hour) | ppm/° C. | 2.2 | 2.05 | 4.2 | 7.5 | 4.1 | 13 |
| Peel strength of polyimide layered product with support (heated at 400° C. for 1 hour) | N/cm | 1.3 | 1.5 | 1.6 | 1.2 | 1 | 1.4 |

|  | Unit | Example 7 | Example 8 | Example 9 | Example 10 | Example 11 |
|---|---|---|---|---|---|---|
| Patten film used | | 1 | 1 | 3 | 4 | 5 |
| Varnish used | | F | G | A3 | A3 | A3 |
| Tensile breaking strength of polyimide layered product with support (heated at 400° C. for 1 hour) | MPa | 375 | 363 | 453 | 335 | 334 |
| Tensile elastic modulus of polyimide layered product with support (heated at 400° C. for 1 hour) | GPa | 5.5 | 6.1 | 8.1 | 5.4 | 7.9 |
| Elongation of polyimide layered product with support (heated at 400° C. for 1 hour) | % | 41 | 38 | 46 | 51 | 43 |
| CTE of polyimide layered product with support (heated at 400° C. for 1 hour) | ppm/° C. | 10.5 | 12 | 4.1 | 7.6 | 10.5 |
| Peel strength of polyimide layered product with support (heated at 400° C. for 1 hour) | N/cm | 1.6 | 1.8 | 1.4 | 1.7 | 1.3 |

| Unit | Unit | Example 12 | Example 13 | Example 14 | Example 15 | Example 16 |
|---|---|---|---|---|---|---|
| Pattern film used | | 3 | 5 | 3 | 4 | 3 |
| Varnish used | | B3 | C3 | D3 | E | F |
| Tensile breaking strength of polyimide layered product with support (heated at 400° C. for 1 hour) | MPa | 480 | 350 | 380 | 340 | 453 |

TABLE 6-continued

| | | | | | | |
|---|---|---|---|---|---|---|
| Tensile elastic modulus of polyimide layered product with support (heated at 400° C. for 1 hour) | GPa | 7.8 | 5.8 | 5.2 | 5.2 | 5.6 |
| Elongation of polyimide layered product with support (heated at 400° C. for 1 hour) | % | 50 | 58 | 54 | 51 | 48 |
| CTE of polyimide layered product with support (heated at 400° C. for 1 hour) | ppm/° C. | 4.3 | 7.6 | 4.5 | 15 | 11.3 |
| Peel strength of polyimide layered product with support heated at 400° C. for 1 hour) | N/cm | 1.4 | 1.3 | 1.5 | 3.7 | 1.4 |

As the polyimide layered products with the support, satisfactory ones without warpage, exfoliation and the like were produced.

Example 17

The preparation of a polyimide layered product with a support was performed in the same manner as that in Example 1 except that the pattern film 1 was immersed in DMSO contained in a tray for 1 minute and then subjected to an immersion treatment with a mixed solution of TMAH (25 wt %) and water (75 wt %). The evaluation results and the like are shown in Table 7 and Table 8.

Example 18

The preparation of a polyimide layered product with a support was performed in the same manner as that in Example 1 except that the pattern film 1 was subjected to an immersion treatment with a mixed solution of TMAH (2.5 wt %), water (7.5 wt %) and DMSO (90 wt %) and then immersed in 0.1 mol/L hydrochloric acid contained in a tray for 1 minute. The evaluation results and the like are shown in Table 7 and Table 8.

TABLE 7

| | Unit | Example 17 | Example 18 |
|---|---|---|---|
| Pattern film used | | 1 | 1 |
| Varnish used | | A3 | A3 |
| Polyimide layered product CTE | ppm/° C. | 2.4 | 2.5 |
| Ra | nm | 0.45 | 0.52 |
| Warpage, exfoliation and turbidity of film and varnish layer | | ○ | ○ |
| Peel strength of varnish layer from film | N/cm | 8.4 | 8.3 |
| Peel strength of varnish layer from film after heating at 400° C. for 1 hour | N/cm | 8.6 | 8.1 |
| Peel strength of varnish layer from film after PCT test | N/cm | 8.2 | 8 |

TABLE 8

| | Unit | Example 17 | Example 18 |
|---|---|---|---|
| Pattern film used | | 1 | 1 |
| Varnish used | | A3 | A3 |
| Tensile breaking strength of polyimide layered product with support (heated at 400° C. for 1 hour) | MPa | 468 | 476 |
| Tensile elastic modulus of polyimide layered product with support (heated at 400° C. for 1 hour) | GPa | 8.2 | 7.9 |
| Elongation of polyimide layered product with support (heated at 400° C. for 1 hour) | % | 42 | 43 |
| (CTE of polyimide layered product with support (heated at 400° C. for 1 hour) | ppm/° C. | 2.5 | 2.3 |
| Peel strength of polyimide layered product with support (heated at 400° C. for 1 hour) | N/cm | 1.6 | 1.5 |

Example 19

Figure 9:
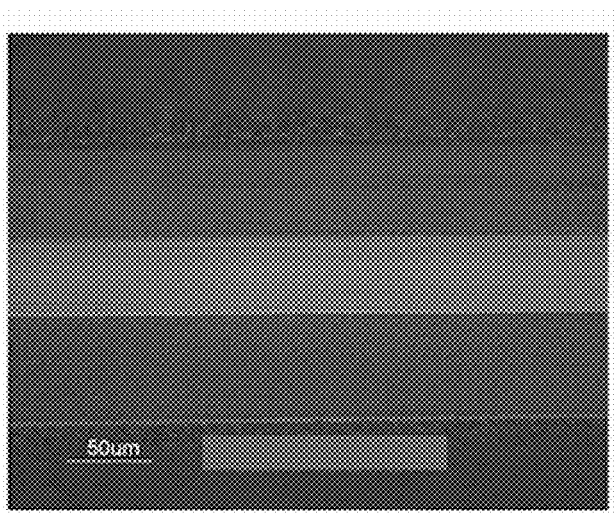
FIG. 9 is an observed image of the cross section of a polyimide layered product prepared in Example 19.

A sample differing in thickness from that in Example 1 was prepared. The evaluation results and the like are shown in Table 9 and FIG. 9.

Example 20

Figure 10:
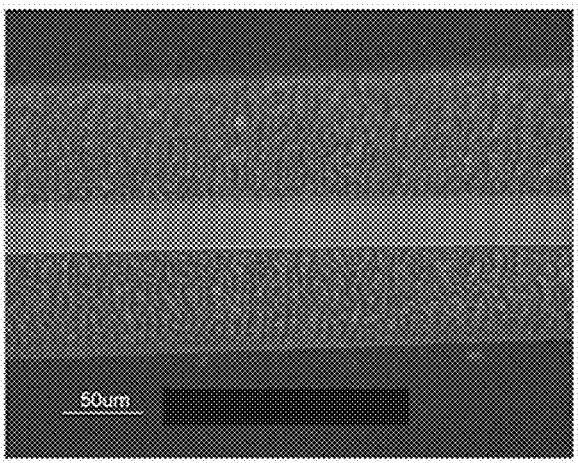
FIG. 10 is an observed image of the cross section of a polyimide layered product prepared in Example 20.

A sample differing in thickness from that in Example 9 was prepared. The evaluation results and the like are shown in Table 9 and FIG. 10.

Example 21

Figure 11:
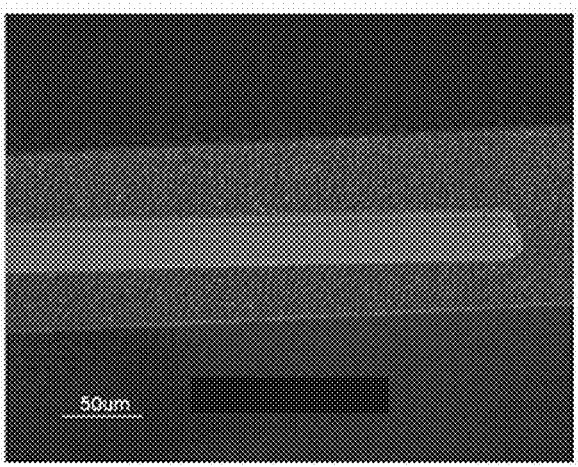
FIG. 11 is an observed image of the cross section of a polyimide layered product prepared in Example 21.

A sample differing in thickness from that in Example 10 was prepared. The evaluation results and the like are shown in Table 9 and FIG. 11.

TABLE 9

| | Unit | Example 19 | Example 20 | Example 21 |
|---|---|---|---|---|
| Pattern film used | | 1 | 1 | 1 |
| Polyamic acid solution (for a layer) | | A2 | B2 | C2 |
| Polyamic acid solution (for b layer) | | A1 | B1 | C1 |

TABLE 9-continued

|  | Unit | Example 19 | Example 20 | Example 21 |
|---|---|---|---|---|
| Thickness (a layer) | μm | 5 | 5 | 5 |
| Thickness (b layer) | μm | 22 | 22 | 22 |
| Thickness of polyimide film | μm | 27 | 27 | 27 |
| Varnish used |  | A3 | B3 | C3 |

Comparative Example 1

Figure 12:
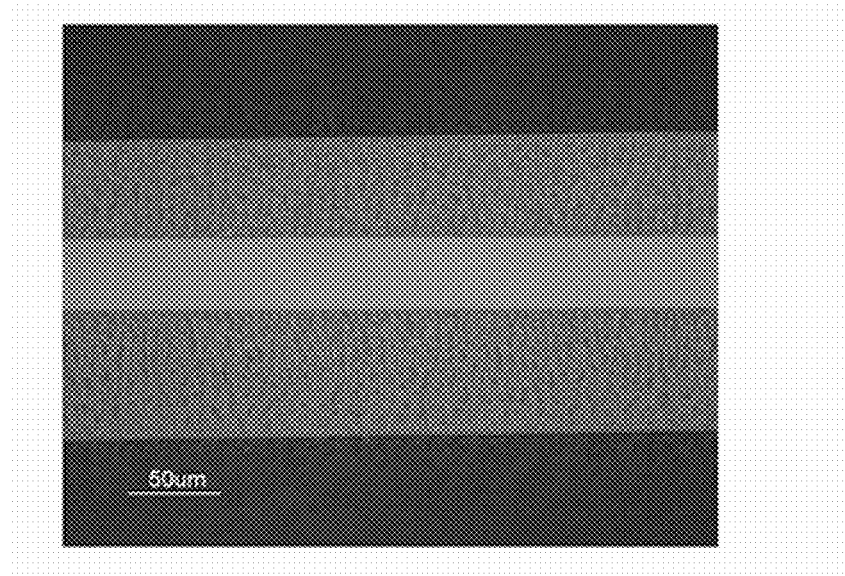
FIG. 12 is an observed image of the cross section of a polyimide layered product prepared in Comparative Example 1.

The preparation of a layered product was performed using the pattern film 1 without applying the varnish thereto nor subjecting the film to an alkali treatment. The evaluation results and the like are shown in Table 10 and FIG. 12.

Comparative Example 2

Without performing a treatment with TMAH, using a spin coater, the varnish A3 was applied to the pattern film 1 with the coating thickness being adjusted so that the thickness after baking became 5 μm. Subsequently, the film was placed in a muffle furnace together with a glass plate and dried at 100° C. for 20 minutes, after which the temperature was elevated to 350° C. over an 80-minute period and then held at 350° C. for 1 hour. Subsequently, the film was taken out of the muffle furnace to prepare a layered product. The evaluation results and the like are shown in Table 10.

Comparative Example 3

The preparation of a layered product was performed in the same manner as that in Comparative Example 2 except that B3 was employed for the varnish layer. The evaluation results and the like are shown in Table 10.

Comparative Example 4

The preparation of a layered product was performed in the same manner as that in Comparative Example 2 except that C3 was employed for the varnish layer. The evaluation results and the like are shown in Table 10.

Comparative Example 5

The preparation of a layered product was performed in the same manner as that in Comparative Example 2 except that D3 was employed for the varnish layer. The evaluation results and the like are shown in Table 10.

Comparative Example 6

The preparation of a layered product was performed in the same manner as that in Comparative Example 2 except that E was employed for the varnish layer. The evaluation results and the like are shown in Table 10.

Comparative Example 7

The preparation of a layered product was performed in the same manner as that in Comparative Example 2 except that F was employed for the varnish layer. The evaluation results and the like are shown in Table 10.

Comparative Example 8

The preparation of a layered product was performed in the same manner as that in Comparative Example 2 except that G was employed for the varnish layer. The evaluation results and the like are shown in Table 10.

TABLE 10

|  | Unit | Comparative Example 1 | Comparative Example 2 | Comparative Example 3 | Comparative Example 4 | Comparative Example 5 |
|---|---|---|---|---|---|---|
| Pattern film used |  | 1 | 1 | 1 | 1 | 1 |
| Varnish used |  | None | A3 | B3 | C3 | D3 |
| Organic alkali treatment |  | Not performed | Not performed | Not performed | Not performed | Not performed |
| Polyimide layered product CTE | ppm/° C. | None | 2.4 | 4.5 | 8.1 | 8.2 |
| Ra | nm | 0.7-2.2 | 0.3 | 0.32 | 0.4 | 0.42 |
| Warpage, exfoliation and turbidity of film and varnish layer |  | None | ○ | ○ | x | x |
| Peel strength of varnish layer from film | N/cm | None | 0.15 | 0.18 | 0.19 | 0.18 |
| Peel strength of varnish layer from film after heating at 400° C. for 1 hour | N/cm | None | 0.13 | 0.14 | 0.17 | 0.17 |
| Peel strength of varnish layer from film after PCT test | N/cm | None | 0.11 | 0.12 | 0.15 | 0.16 |

|  |  | Comparative Example 6 | Comparative Example 7 | Comparative Example 8 |
|---|---|---|---|---|
| Pattern film used |  | 1 | 1 | 1 |
| Varnish used |  | E | F | G |
| Organic alkali treatment |  | Not performed | Not performed | Not performed |
| Polyimide layered product CTE |  | 8.4 | 7.6 | 7.8 |
| Ra |  | 0.45 | 0.47 | 0.38 |
| Warpage, exfoliation and turbidity of film and varnish layer |  | Δ | Δ | Δ |
| Peel strength of varnish layer from film |  | 0.07 | 0.08 | 0.09 |

TABLE 10-continued

| | | | |
|---|---|---|---|
| Peel strength of varnish layer from film after heating at 400° C. for 1 hour | 0.06 | 0.07 | 0.06 |
| Peel strength of varnish layer from film after PCT test | 0.05 | 0.05 | 0.04 |

Comparative Examples 9 to 11

Polyimide layered products with a support for comparison were obtained in the same manners as those in Examples 1, 3 and 4 except that the support was not subjected to a coupling agent treatment. The evaluation results for the obtained polyimide layered products with the support are shown in Table 11. In this connection, "unmeasurable" in the table refers to the case where the polyimide film has peeled off during the course of the treatment or measurement. Since the supporting base material and the film are not strongly bonded to each other, it was difficult to evaluate items other than those shown in the table.

TABLE 11

| | Unit | Comparative Example 9 | Comparative Example 10 | Comparative Example 11 |
|---|---|---|---|---|
| Pattern film used | | 1 | 1 | 1 |
| Varnish layer used | | A3 | B3 | C3 |
| Thickness of SC treatment layer | nm | 0 | 0 | 0 |
| Peel strength of UV unirradiated part | N/cm | 0.12 | 0.14 | 0.15 |
| Peel strength of UV irradiated part | N/cm | 0.05 | 0.13 | 0.11 |

Comparative Examples 12 to 14

Polyimide layered products with a support for comparison were obtained in the same manners as those in Examples 1, 3 and 4 except that the UV irradiation treatment was not performed. The evaluation results for the obtained polyimide layered products with the support are shown in Table 12. With regard to the polyimide layered product with the support, although an incision was made at a polyimide film portion and an attempt was made to peel off the film from the support, the film failed to be successfully peeled off and the film was broken when forcibly peeled off.

TABLE 12

| | Unit | Comparative Example 11 | Comparative Example 13 | Comparative Example 14 |
|---|---|---|---|---|
| Pattern film used | | 1 | 1 | 1 |
| Varnish used | | A3 | B3 | C3 |
| Thickness of SC treatment layer | nm | 11 | 11 | 11 |
| Peel strength of UV inirradiated part | N/cm | 1.2 | 1.3 | 1.1 |
| Peel strength of UV irradiated part | N/cm | There is no UV irradiated part | There is no UV irradiated part | There is no UV irradiated part |

Comparative Example 15

The preparation of a layered product was performed in the same manner as that in Example 1 except that a surface treatment with KOH as an inorganic alkali was performed as the alkali treatment. The evaluation results and the like are shown in Table 13. It is difficult to maintain the adhesive force by the inorganic alkali treatment.

TABLE 13

| | Comparative Example 18 |
|---|---|
| Pattern film used | 1 |
| Varnish used | A3 |
| Warpage, exfoliation and turbidity of film and varnish layer | x |

Application Example 1

<Device Preparation Example>

By covering each of the polyimide layered products with the support obtained in Examples 1 to 8 and Comparative Examples 1 to 8 with a stainless steel frame having an opening part, the layered product was fixed so that a substrate holder in a sputtering apparatus and the support of the layered product were brought into close contact with each other. By allowing a refrigerant to flow through the inside of the substrate holder, the polyimide layered product with the support was constituted so that the temperature of the varnish surface thereof was appropriately set, and the temperature of the varnish surface of the polyimide layered product with the support was set to 2° C. First, SiON was layered on the surface of the polyimide layered product with the support by a sputtering treatment. The sputtering conditions were set to the conditions of frequency 13.56 MHz, output 200 W, and gas pressure 1×10 TORR, and the temperature at the time of the treatment and the treatment time were set to 2° C. and 2 minutes, respectively. Then, under the conditions of frequency 13.56 MHz, output 450 W, and gas pressure $3 \times 10^{-3}$ Torr, using an alumel alloy target and a chromel alloy target, by a DC magnetron sputtering method under an argon atmosphere, an alumel thin film and a chromel thin film, which were patterned at a rate of 1 nm/second with a metal mask of 150 nm in thickness, were sequentially formed so as to be crossed. By allowing a gas barrier layer to be deposited thereon except for an electrode extraction portion, a thin film type thermocouple was produced as a polyimide layered product with a device with a support.

In the case where each of the polyimide layered products with the support in Examples 1 to 8 was used, since the surface of the polyimide layered product with the device with the support was excellent in smoothness, there was no problem in device performance. In contrast, in the case where any polyimide layered product with the support in the respective comparative examples was used, the thermoelectromotive force from the thermocouple was decreased with the lapse of time when the layered product was heated to 300° C. and kept at the constant temperature.

From the results of the foregoing application example, it has been confirmed that a polyimide layered product with a device with a support in which the surface smoothness is properly adjusted by the production method according to the present invention is capable of withstanding each process such as a metallization process.

INDUSTRIAL APPLICABILITY

The layered product obtained by the production method according to the present invention enables a sophisticated device to be stacked thereon, and when a device is stacked thereon, it is possible to make an incision at a polyimide layered product portion of the easily releasable part and to peel off the resin layer along the inorganic layer easily from the support.

The layered product according to the present invention can be effectively used for a process of producing a fine circuit substrate on a resin which is extremely small and thin, a device structural body and the like, and since the layered product has heat resistance capable of withstanding a process in which the temperature is elevated such as a metallization process, and is small in dimensional change at the time of the subsequent pattern formation, it is possible to obtain a circuit pattern with a small error. Furthermore, as necessary, peeling off this inorganic substrate can be smoothly performed, a circuit or a device can be formed with precision on an extremely thin resin film excellent in insulation properties, heat resistance and dimensional stability, and therefore, the layered product is effective in producing a device such as a fine circuit board and a sensor.

REFERENCE SIGNS LIST

FIG. 1

1: Glass substrate
2: Coupling agent layer
3: UV light cut-off mask
4: UV light unirradiated part of coupling agent layer
5: UV light irradiated part of coupling agent layer
6: Polyimide film
7: Polyimide film positioned on UV light irradiated part of coupling agent layer
8: Varnish layer
9: Varnish layer positioned on UV light irradiated part of coupling agent layer
10: Polyimide layered product positioned on UV light irradiated part of coupling agent layer

FIG. 2

1: Glass substrate
2: Coupling agent layer
3: UV light cut-off mask
4: UV light unirradiated part of coupling agent layer
5: UV light irradiated part of coupling agent layer
6: Polyimide film
7: Polyimide film positioned on UV light irradiated part of coupling agent layer
8: Varnish layer
9: Varnish layer positioned on UV light irradiated part of coupling agent layer
10: Device
11: Polyimide layered product with device

FIG. 3

1: Polyimide film
2: Epoxy resin layer
3: Varnish layer

The invention claimed is:

1. A method for producing a polyimide layered product with a support comprising at least the support and the polyimide layered product, said polyimide layered product being a layered product having a structure of at least three layers in which at least one layer contains a slip agent and both surface layers have no slip agent, comprising:
   preparing a polyimide film with a face opposite to said support and subjected to a surface treatment;
   subjecting at least one of a face of said support and the face of said polyimide film which are opposite to each other to a patterning treatment using a coupling agent to form a satisfactorily bondable part and an easily releasable part which differ in adhesion/peel strength; subsequently,
   superposing said support and said polyimide film to be subjected to a pressurizing/heating treatment;
   subjecting said polyimide film to an organic alkali treatment after the polyimide film is bonded to the support by said pressurizing/heating treatment; and
   then, applying a polyamic acid solution (A) free from a slip agent ingredient, drying the coating film and imidizing the film.

2. The method according to claim 1, wherein said polyamic acid solution (A) is a polyamic acid solution obtained by the reaction of an aromatic tetracarboxylic acid and an aromatic diamine having a benzoxazole structure (skeleton).

3. The method according to claim 1, wherein said polyamic acid solution (A) is a polyamic acid solution obtained by the reaction of 3,3',4,4'-biphenyltetracarboxylic acid dianhydride and an aromatic diamine.

4. The method according to claim 1, wherein said patterning treatment is performed by subjecting the face to a coupling agent treatment to form a coupling-treated layer, and then, subjecting a part of the coupling-treated layer to a deactivation treatment to form a prescribed pattern.

5. The method according to claim 4, wherein at least one kind selected from the group consisting of a blast treatment, a vacuum plasma treatment, an atmospheric pressure plasma treatment, a corona treatment, an active radiation irradiation treatment, an active gas treatment, a UV irradiation treatment, an ozone treatment and a chemical liquid treatment is performed as said deactivation treatment.

6. The method according to claim 5, wherein at least the UV irradiation treatment is performed as said deactivation treatment.

7. The method according to claim 1, wherein a film obtained by the reaction of an aromatic diamine having a benzoxazole structure and tetracarboxylic acid is used as said polyimide film.

* * * * *